(12) United States Patent
Kim et al.

(10) Patent No.: US 12,527,168 B2
(45) Date of Patent: Jan. 13, 2026

(54) TRANSPARENT DISPLAY DEVICE

(71) Applicant: LG Display Co., Ltd., Seoul (KR)

(72) Inventors: MoonSoo Kim, Paju-si (KR); Dohong Kim, Paju-si (KR); Sungbai Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 553 days.

(21) Appl. No.: 17/977,706

(22) Filed: Oct. 31, 2022

(65) Prior Publication Data

US 2023/0172008 A1 Jun. 1, 2023

(30) Foreign Application Priority Data

Nov. 26, 2021 (KR) ........................ 10-2021-0165868

(51) Int. Cl.
*H10K 59/123* (2023.01)

(52) U.S. Cl.
CPC .................................. *H10K 59/123* (2023.02)

(58) Field of Classification Search
CPC .... H10K 59/123; H01H 87/00; H01H 69/022; H01H 2085/0275; H01H 2085/0283; H01H 85/046; H01H 85/06; H01H 85/463
See application file for complete search history.

(56) References Cited

U.S. PATENT DOCUMENTS

| | | | |
|---|---|---|---|
| 6,995,736 B2* | 2/2006 | Eida | H10K 59/123 |
| | | | 315/169.3 |
| 8,466,457 B2* | 6/2013 | Birnstock | H10K 59/86 |
| | | | 257/E51.001 |
| 2002/0036471 A1* | 3/2002 | Silvestre | H10K 59/805 |
| | | | 315/169.3 |
| 2011/0018434 A1* | 1/2011 | Miyaguchi | H10K 50/826 |
| | | | 313/512 |
| 2012/0153831 A1* | 6/2012 | Kasai | H10K 59/805 |
| | | | 315/121 |
| 2013/0187186 A1* | 7/2013 | Popp | H10K 59/8052 |
| | | | 257/99 |
| 2013/0278144 A1* | 10/2013 | Levermore | H10K 59/805 |
| | | | 315/121 |
| 2014/0167000 A1* | 6/2014 | Jeon | H10K 59/80516 |
| | | | 438/34 |

(Continued)

*Primary Examiner* — Bryan R Junge
(74) *Attorney, Agent, or Firm* — Seed Intellectual Property Law Group LLP

(57) ABSTRACT

A transparent display device is provided, which may allow only an area, in which particles occur, to definitely become a dark spot. The transparent display device comprises a plurality of transmissive areas, and a plurality of subpixels disposed between the plurality of transmissive areas. Each of the plurality of subpixels includes a driving transistor including an active layer, a gate electrode, a source electrode and a drain electrode, a light emitting element including a first electrode, a light emitting layer and a second electrode, and a conductive organic layer provided between the driving transistor and the first electrode of the light emitting element to electrically connect the driving transistor with the first electrode. The first electrode includes a first electrode portion and a second electrode portion, and the conductive organic layer is electrically connected to the first electrode portion through a first contact hole and is electrically connected to the second electrode portion through a second contact hole.

17 Claims, 12 Drawing Sheets

(56) References Cited

U.S. PATENT DOCUMENTS

| | | | |
|---|---|---|---|
| 2014/0246658 A1* | 9/2014 | Yoshida | H10K 59/179 |
| | | | 438/23 |
| 2017/0294155 A1* | 10/2017 | Kim | G09G 3/2074 |
| 2018/0130859 A1* | 5/2018 | Nishimura | H10K 59/123 |
| 2018/0198084 A1* | 7/2018 | Kimura | H10K 59/131 |
| 2021/0143373 A1* | 5/2021 | Kim | H10K 71/00 |
| 2021/0225957 A1* | 7/2021 | Song | H10K 59/131 |
| 2023/0082757 A1* | 3/2023 | Lee | H10K 59/124 |
| | | | 257/40 |

* cited by examiner

TRANSPARENT DISPLAY DEVICE

BACKGROUND

Technical Field

The present disclosure relates to a transparent display device.

Description of the Related Art

A display device may include a first electrode, a light emitting layer and a second electrode, which are sequentially stacked, and may emit light through the light emitting layer when a voltage is applied to the first electrode and the second electrode. In this display device, particles may occur on the first electrode during a manufacturing process, and in this case, a short may occur between the first electrode and the second electrode in the area in which the particles occur. For this reason, the display device has a problem in that all of subpixels in which particles occur become dark spots so as not to emit light.

Recently, studies for a transparent display device in which a user may view objects or images positioned at an opposite side by transmitting the display device are actively ongoing.

The transparent display device includes a display area on which an image is displayed, and a non-display area, wherein the display area may include a transmissive area capable of transmitting external light and a non-transmissive area. The transparent display device may have high light transmittance in the display area through the transmissive area.

BRIEF SUMMARY

The inventors have realized that the transparent display device may have a small size of a light emission area due to a transmissive area as compared with a general display device. Therefore, in the transparent display device, when all of subpixels in which particles occur become dark spots due to the particles, luminance may be more deteriorated than in a general display device that does not have the transmissive areas.

The present disclosure has been made in view of the above problems and it is a technical benefit of the present disclosure to provide a transparent display device that may reduce a size of a light emission area that becomes a dark spot.

It is another technical benefit of the present disclosure to provide a transparent display device that may allow only an area, in which particles occur, to definitely become a dark spot.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a plurality of transmissive areas, and a plurality of subpixels disposed between the plurality of transmissive areas. Each of the plurality of subpixels includes a driving transistor including an active layer, a gate electrode, a source electrode and a drain electrode, a light emitting element including a first electrode, a light emitting layer and a second electrode, and a conductive organic layer provided between the driving transistor and the first electrode of the light emitting element to electrically connect the driving transistor with the first electrode. The first electrode includes a first divided electrode and a second divided electrode, and the conductive organic layer is electrically connected to the first divided electrode through a first contact hole and is electrically connected to the second divided electrode through a second contact hole.

In accordance with another aspect of the present disclosure, the above and other technical benefits can be accomplished by the provision of a transparent display device comprising a driving transistor, a conductive organic layer having first conductivity, electrically connected to the driving transistor, an organic pattern provided over the conductive organic layer to expose at least a portion of the conductive organic layer, having second conductivity smaller than the first conductivity, a planarization layer provided over the conductive organic layer and the organic pattern, a first electrode provided over the planarization layer and electrically connected to the conductive organic layer through a contact hole, a light emitting layer provided over the first electrode, and a second electrode provided over the light emitting layer.

BRIEF DESCRIPTION OF THE SEVERAL VIEWS OF THE DRAWINGS

The above and other technical benefits, features and other advantages of the present disclosure will be more clearly understood from the following detailed description taken in conjunction with the accompanying drawings, in which.

DETAILED DESCRIPTION

Figure 1:
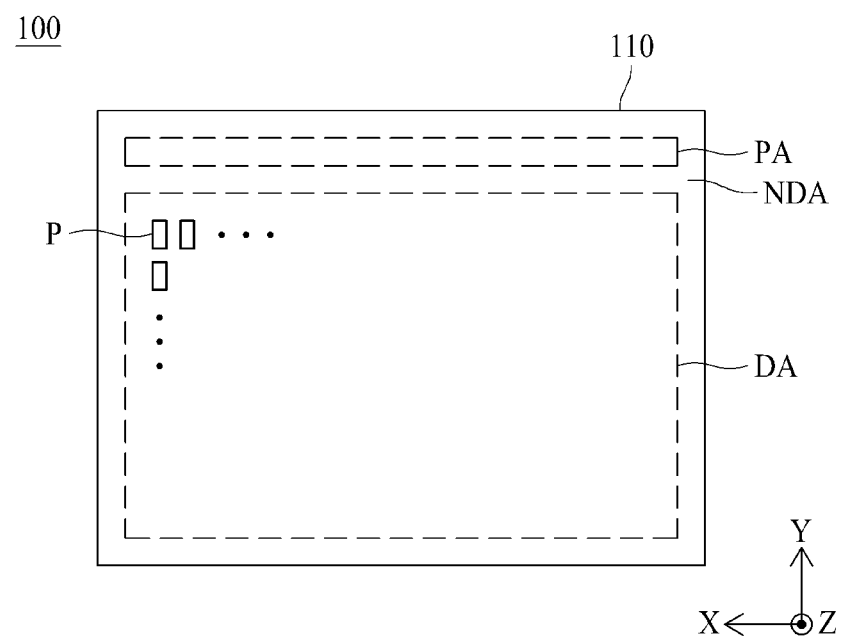
FIG. 1 is a schematic plane view illustrating a transparent display panel according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless otherwise mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Figure 2:
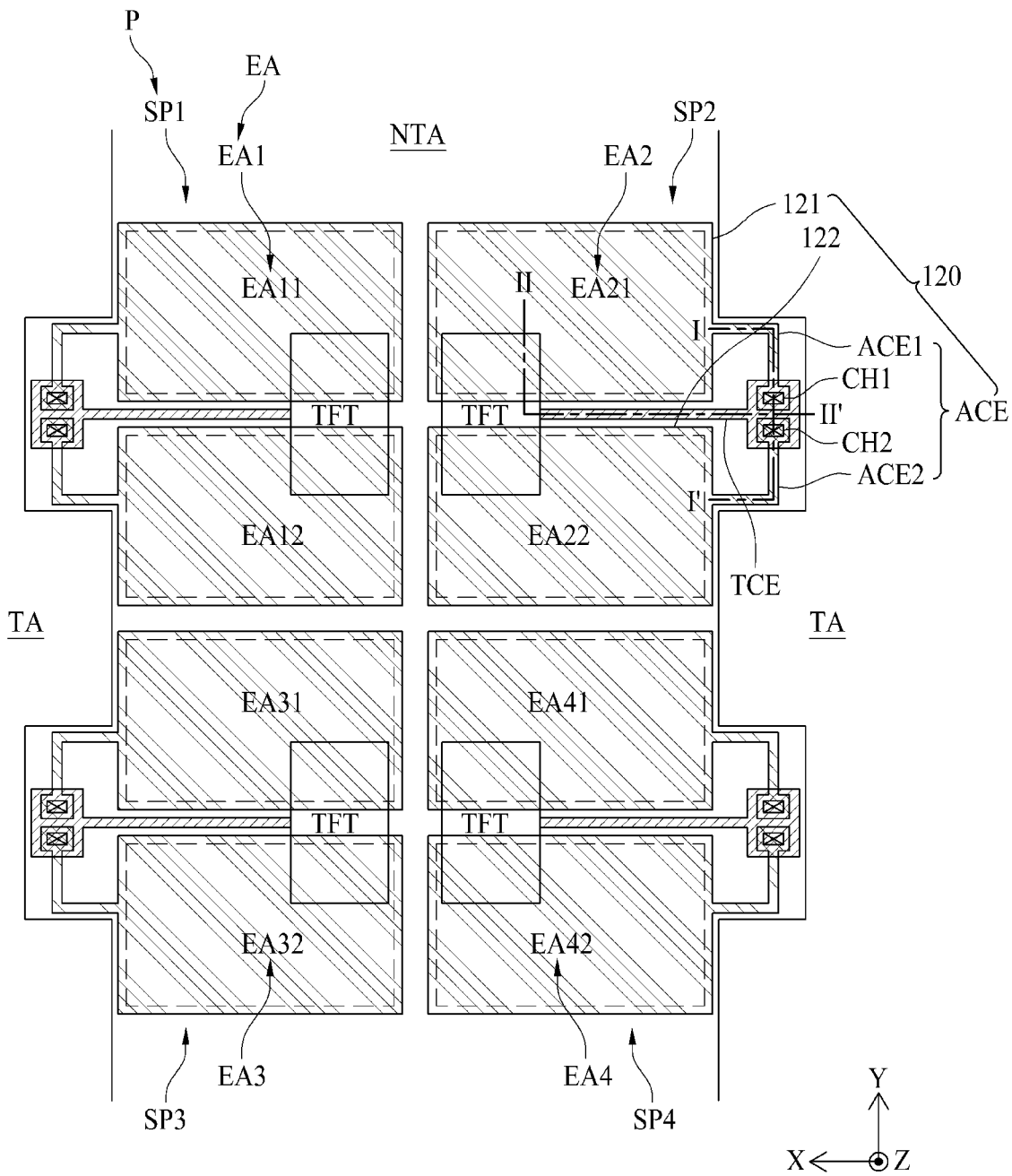
FIG. 2 is a view illustrating an example of a pixel of a transparent display panel shown in FIG. 1.
Figure 3:
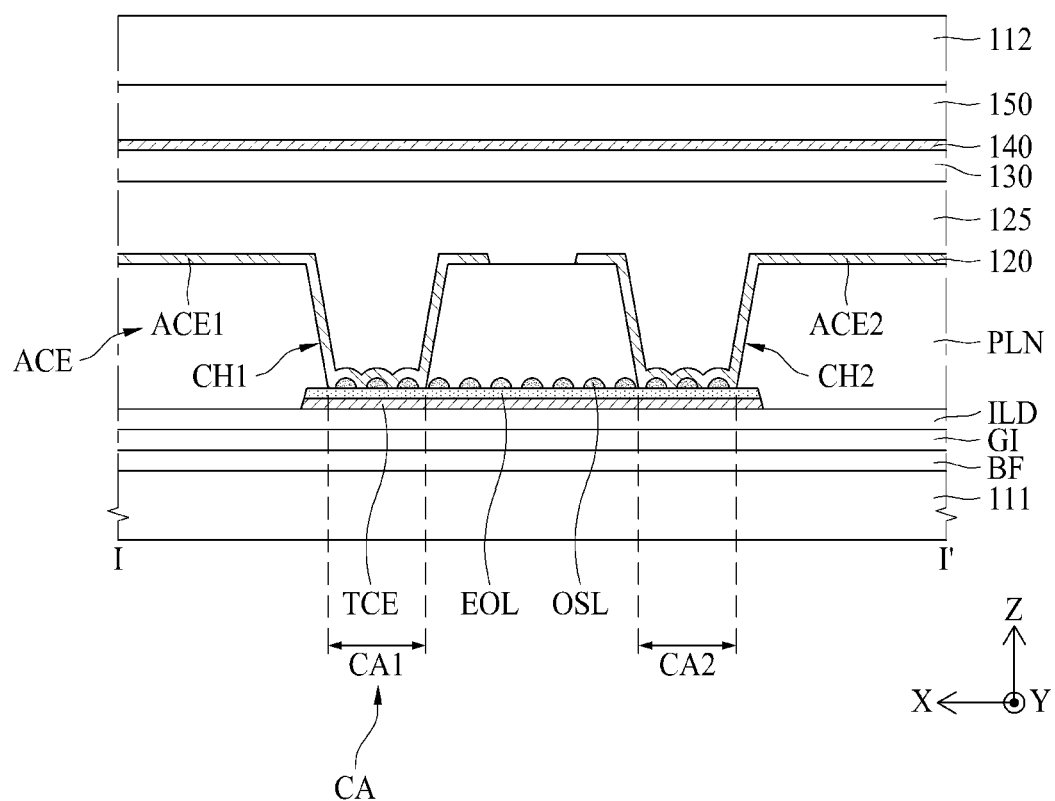
FIG. 3 is a cross-sectional view illustrating a first example of line I-I' of FIG. 2.
Figure 4:
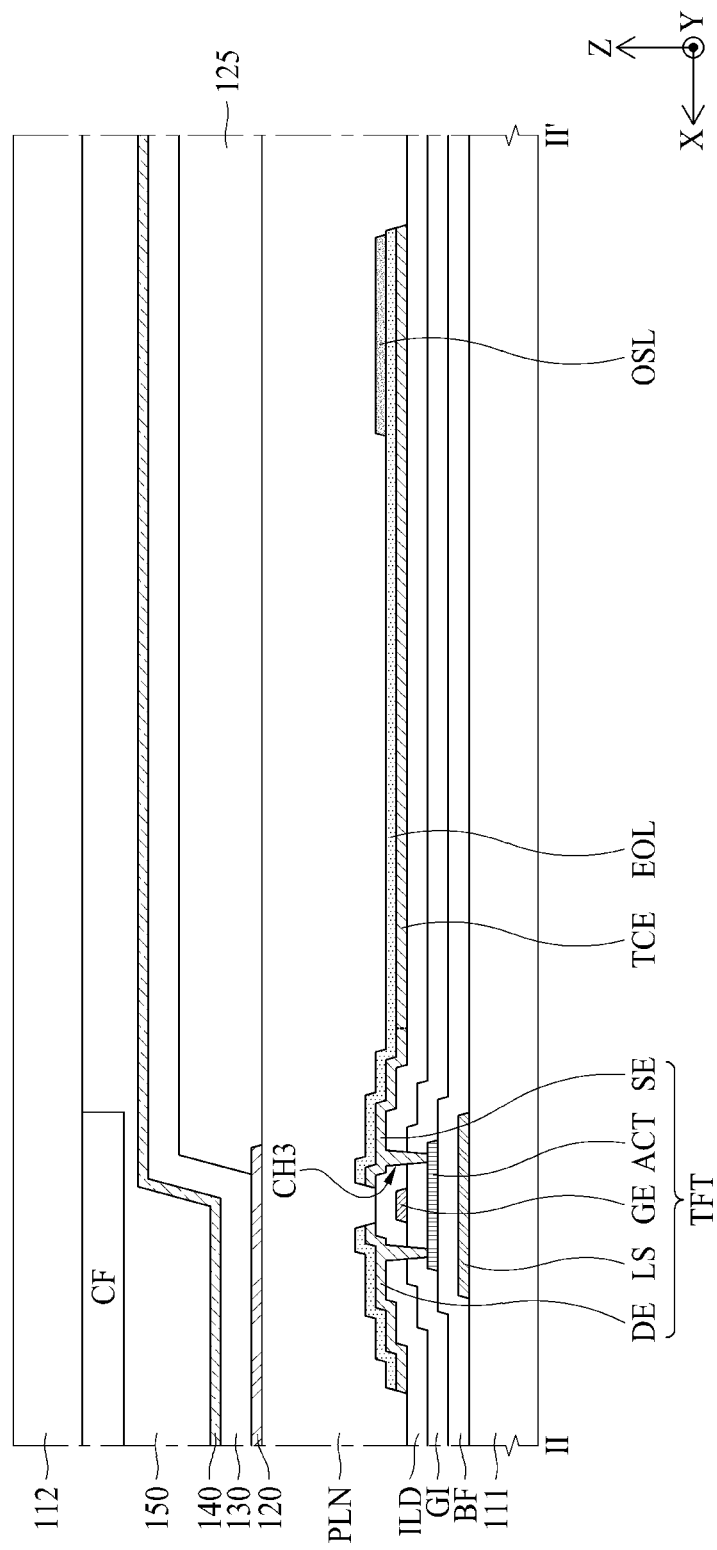
FIG. 4 is a cross-sectional view illustrating a first example of line II-II' of FIG. 2.
Figure 5:
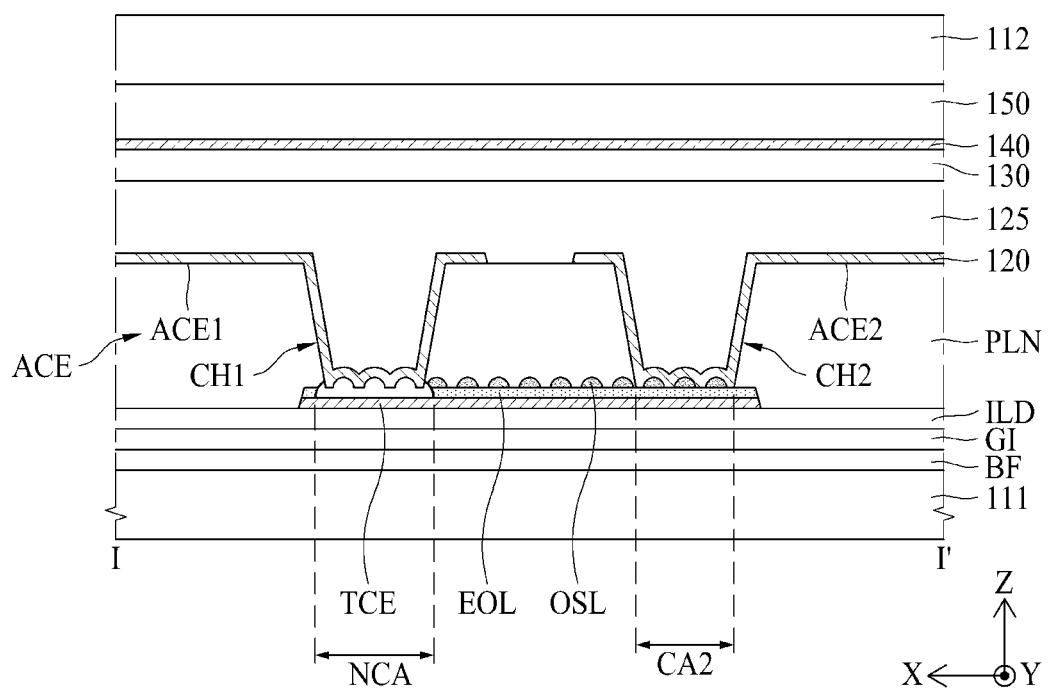
FIG. 5 is a view illustrating an example in which particles occur in one of a plurality of divided electrodes in FIG. 3.
Figure 6:
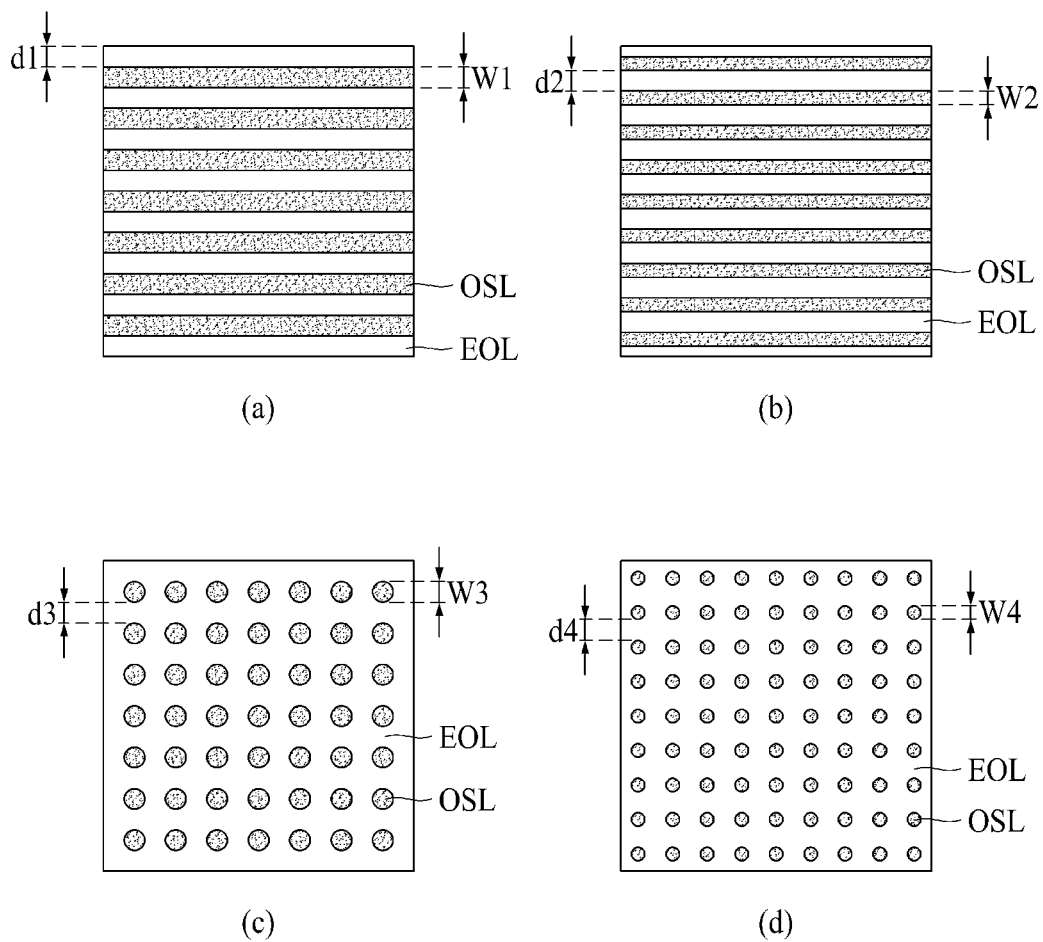
FIG. 6 is a view illustrating a shape of an organic pattern.
Figure 7:
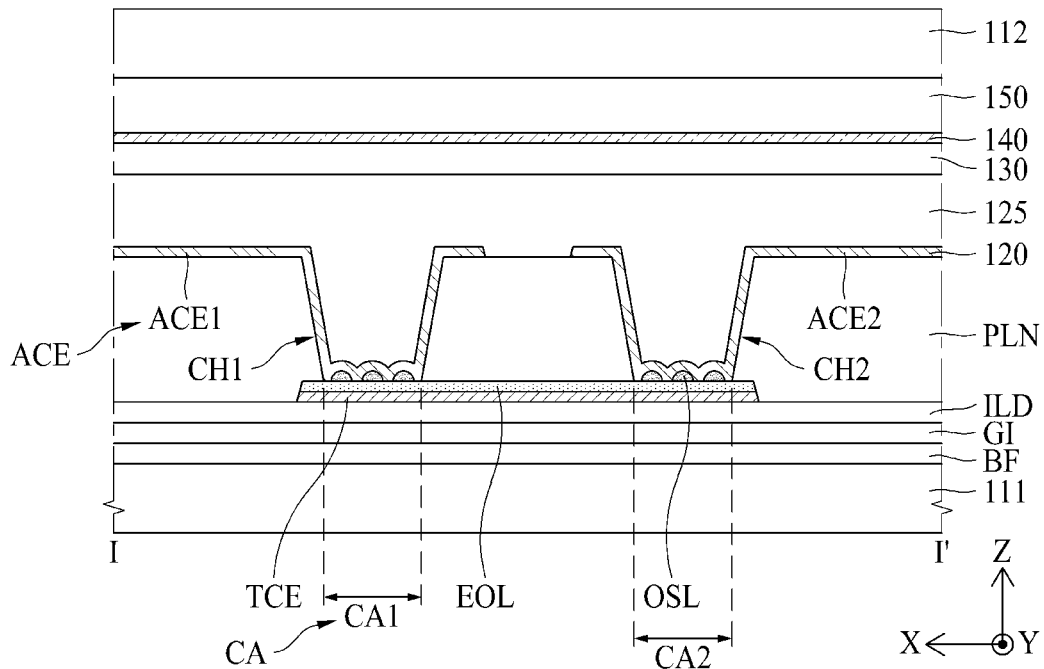
FIG. 7 is a cross-sectional view illustrating a second example of line I-I' of FIG. 2.
Figure 8:
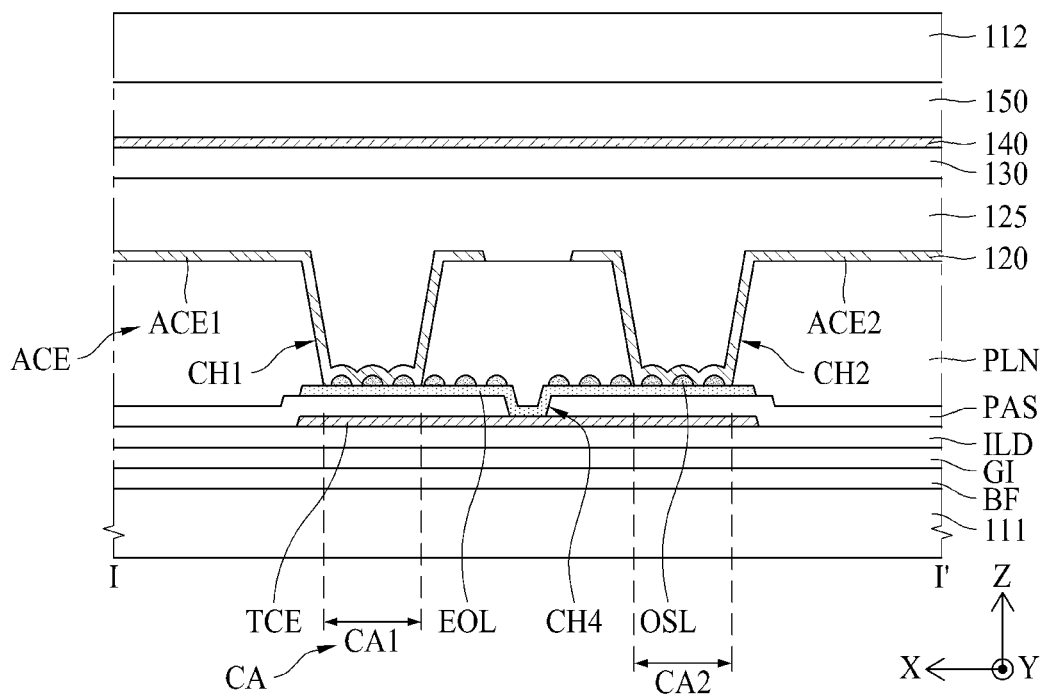
FIG. 8 is a cross-sectional view illustrating a third example of line I-I' of FIG. 2.
Figure 9:
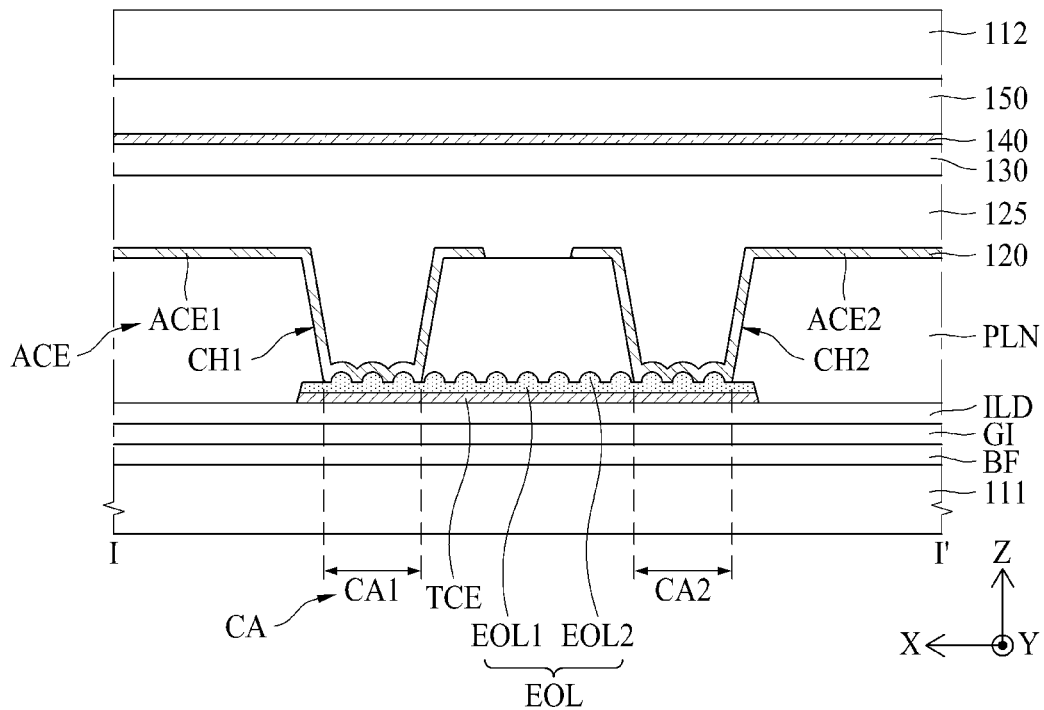
FIG. 9 is a cross-sectional view illustrating a fourth example of line I-I' of FIG. 2.
Figure 10:
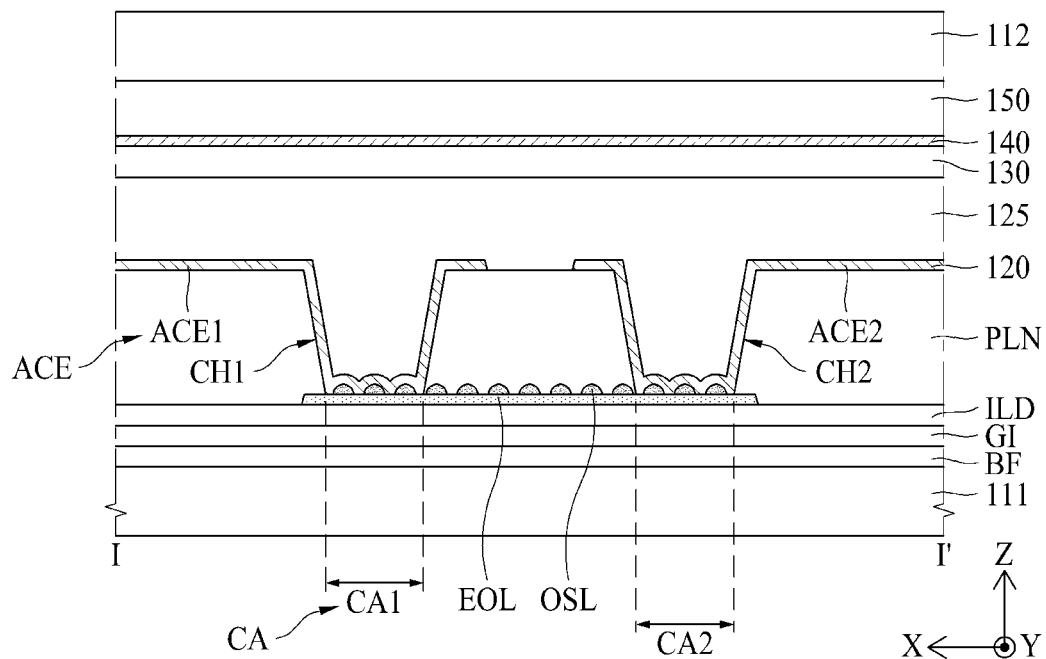
FIG. 10 is a cross-sectional view illustrating a fifth example of line I-I' of FIG. 2.
Figure 11:
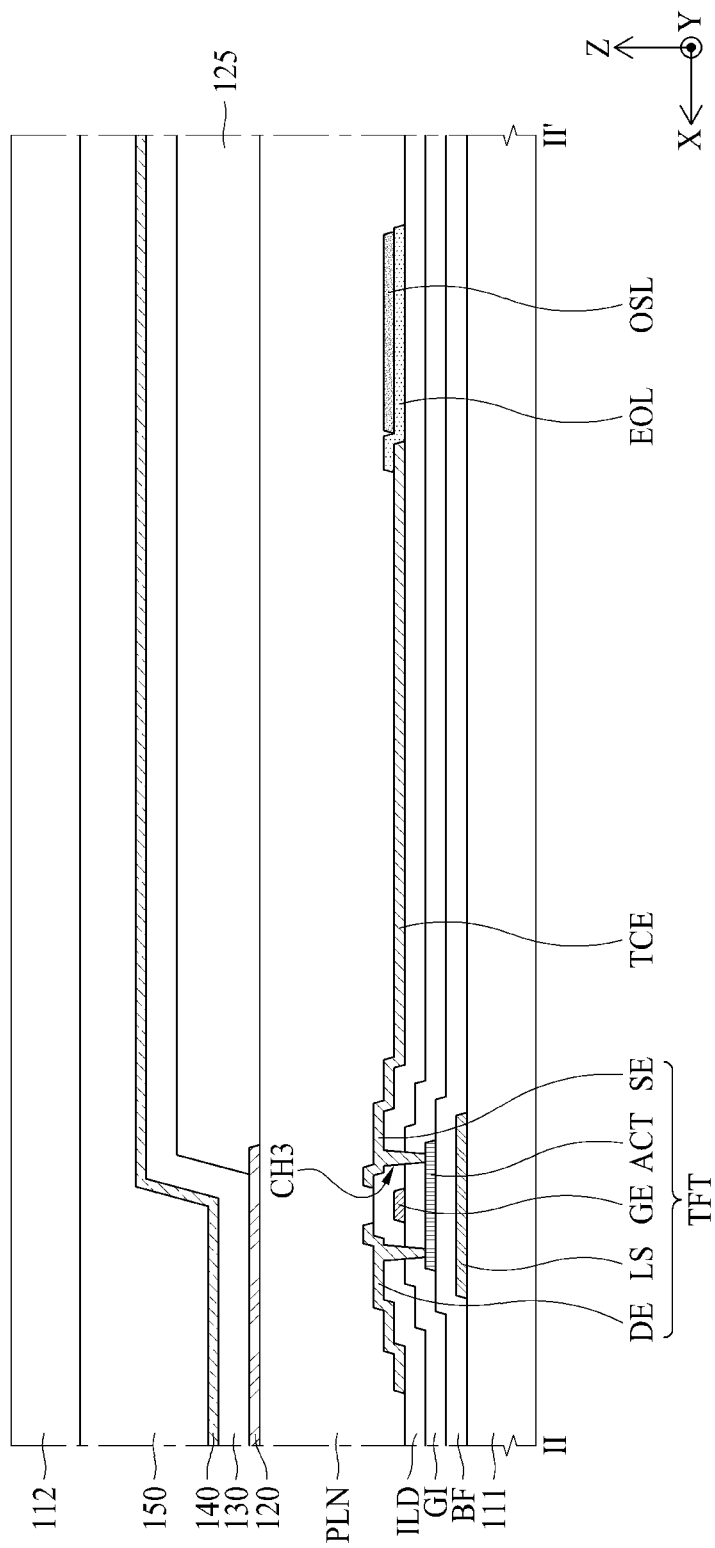
FIG. 11 is a cross-sectional view illustrating a fifth example of line II-II' of FIG. 2.

FIG. 1 is a schematic plane view illustrating a transparent display panel according to one embodiment of the present disclosure, FIG. 2 is a view illustrating an example of a pixel of a transparent display panel shown in FIG. 1, FIG. 3 is a cross-sectional view illustrating a first example of line I-I' of FIG. 2, FIG. 4 is a cross-sectional view illustrating a first example of line II-II' of FIG. 2, FIG. 5 is a view illustrating an example in which particles occur in one of a plurality of divided electrodes in FIG. 3, FIG. 6 is a view illustrating a shape of an organic pattern, FIG. 7 is a cross-sectional view illustrating a second example of line I-I' of FIG. 2, FIG. 8 is a cross-sectional view illustrating a third example of line I-I' of FIG. 2, FIG. 9 is a cross-sectional view illustrating a fourth example of line I-I' of FIG. 2, FIG. 10 is a cross-sectional view illustrating a fifth example of line I-I' of FIG. 2, and FIG. 11 is a cross-sectional view illustrating a fifth example of line II-II' of FIG. 2.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIGS. 1 to 11, a transparent display device 100 according to one embodiment of the present disclosure includes a transparent display panel 110. The transparent display panel 110 includes a first substrate 111 and a second substrate 112, which face each other. The second substrate 112 may be an encapsulation substrate. The first substrate 111 may be a plastic film, a glass substrate or a silicon wafer substrate formed using a semiconductor process. The second substrate 112 may be a plastic film, a glass substrate or an encapsulation film. The first substrate 111 and the second substrate 112 may be made of a transparent material.

The transparent display panel 110 may be categorized into a display area DA in which pixels P are provided to display an image, and a non-display area NDA for not displaying an image. The non-display area NDA may include a pad area PA in which pads such as power pads and data pads are disposed, and at least one scan driver (not shown).

The scan driver is connected to scan lines to supply scan signals. The scan driver may be disposed on one side or both sides of the display area DA in a gate driver in panel (GIP) mode. For example, the scan driver may be disposed on both sides of the display area DA, but is not limited thereto. The scan driver may be disposed only on one side of the display area DA.

The display area DA includes a transmissive area TA and a non-transmissive area NTA as shown in FIG. 2. The transmissive area TA is an area through which most of light incident from the outside passes, and the non-transmissive area NTA is an area through which most of light incident from the outside does not transmit. For example, the transmissive area TA may have light transmittance of $\alpha$%, for example, greater than 90%, and the non-transmissive area NTA may be an area having light transmittance of $\beta$%, for example, smaller than 50%. At this time, $\alpha$ is a value greater than $\beta$. A user may view an object or background positioned on a rear surface of the transparent display panel 110 due to the transmissive areas TA.

The non-transmissive area NTA may be disposed between adjacent transmissive areas TA, and may include a plurality of pixels P and a plurality of signal lines. The plurality of signal lines may include scan lines extended in a first direction (X-axis direction) and data lines extended in a second direction (Y-axis direction) in the non-transmissive area NTA.

The pixels P may be disposed between the transmissive areas TA to emit predetermined or selected light, thereby displaying an image. A light emission area EA may correspond to an area that emits light in the pixel P.

Each of the pixels P may include at least one of a first subpixel SP1, a second subpixel SP2, a third subpixel SP3, and a fourth subpixel SP4. The first subpixel SP1 includes a first light emission area EA1 emitting red light, the second subpixel SP2 includes a second light emission area EA2 emitting green light, the third subpixel SP3 includes a third light emission area EA3 emitting blue light, and the fourth subpixel SP4 includes a fourth light emission area EA4 emitting white light, but these subpixels are not limited thereto. Each of the pixels P may include subpixels that emit light with colors other than red, green, blue, and white. In addition, various modifications may be made in the arrangement order of the subpixels SP1, SP2, SP3 and SP4.

The light emission areas EA1, EA2, EA3 and EA4 respectively provided in the plurality of subpixels SP1, SP2, SP3 and SP4 may include a plurality of divided light emission areas. In detail, the first light emission area EA1 provided in the first subpixel SP1 is divided into two and thus may include a first divided light emission area EA11 and a second divided light emission area EA12. The second light emission area EA2 provided in the second subpixel SP2 is divided into two and thus may include a first divided light emission area EA21 and a second divided light emission area EA22. The third light emission area EA3 provided in the third subpixel SP3 is divided into two and thus may include a first divided light emission area EA31 and a second divided light emission area EA32. The fourth light emission area EA4 provided in the fourth subpixel SP4 is divided into two and thus may include a first divided light emission area EA41 and a second divided light emission area EA42.

Hereinafter, for convenience of description, the first subpixel SP1 is a red subpixel emitting red light, the second subpixel SP2 is a green subpixel emitting green light, the third subpixel SP3 is a blue subpixel emitting blue light, and the fourth subpixel SP4 is a white subpixel emitting white light.

Each of the first subpixel SP1, the second subpixel SP2, the third subpixel SP3 and the fourth subpixel SP4 may include a circuit element, which includes a capacitor, a thin film transistor and the like, and a light emitting element. The thin film transistor may include a switching transistor, a sensing transistor and a driving transistor (TFT).

The switching transistor is switched in accordance with the scan signal supplied to the scan line to supply a data voltage supplied from the data line to the driving transistor TFT.

The sensing transistor serves to sense a threshold voltage deviation of the driving transistor TFT, which causes degradation of image quality.

The driving transistor TFT is switched in accordance with the data voltage supplied from a switching thin film transistor, generates a data current from a power source supplied from a pixel power line and supplies the data current to a first electrode 120 of the subpixel. The driving transistor TFT includes an active layer ACT, a gate electrode GE, a source electrode SE and a drain electrode DE.

The capacitor serves to maintain the data voltage supplied to the driving transistor TFT for one frame. The capacitor may include, but is not limited to, two capacitor electrodes. In one embodiment, the capacitor may include three capacitor electrodes.

In detail, the active layer ACT may be provided over the first substrate 111. The active layer ACT may include a silicon-based semiconductor material or an oxide-based semiconductor material.

As shown in FIG. 4, a light shielding layer LS may be provided between the first substrate 111 and the active layer ACT. The light shielding layer LS serves to shield external light incident over the active layer ACT in the area where the driving transistor TFT is provided. The light shielding layer LS may include a single layer or multiple layers made of any one of molybdenum (Mo), aluminum (Al), chromium (Cr), gold (Au), titanium (Ti), nickel (Ni), neodymium (Nd) and copper (Cu) or their alloy. A buffer layer BF may be provided between the light shielding layer LS and the active layer ACT.

A gate insulating layer GI may be provided over the active layer ACT. The gate insulating layer GI may include an inorganic layer, for example, a silicon oxide layer (SiOx), a silicon nitride layer (SiNx), or multiple layers of SiOx and SiNx.

A gate electrode GE may be provided over the gate insulating layer GI. The gate electrode GE may include a single layer or multiple layers made of one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may include an inorganic layer, for example, a silicon oxide layer (SiOx), a silicon nitride layer (SiNx), or multiple layers of SiOx and SiNx.

The source electrode SE and the drain electrode DE may be provided over the interlayer dielectric layer ILD. One of the source electrode SE and the drain electrode DE may be connected to the active layer ACT through a contact hole that passes through the gate insulating layer GI and the interlayer dielectric layer ILD.

The source electrode SE and the drain electrode DE may include a single layer or multiple layers made of one of molybdenum (Mo), aluminum (Al), chromium (Cr), gold (Au), titanium (Ti), nickel (Ni), neodymium (Nd) and copper (Cu), or their alloy.

A conductive organic layer EOL may be provided over the source electrode SE and the drain electrode DE. The conductive organic layer EOL may have first conductivity, and may be electrically connected to the source electrode SE or the drain electrode DE. Since the conductive organic layer EOL has electrical conductivity, the conductive organic layer EOL may electrically connect the source electrode SE or the drain electrode DE of the driving transistor TFT with the first electrode 120 of the light emitting element.

An organic pattern OSL may be provided over the conductive organic layer EOL. The organic pattern OSL may have second conductivity smaller than the first conductivity. That is, the organic pattern OSL may have conductivity lower than that of the conductive organic layer EOL, or may have insulating properties.

The organic pattern OSL includes a plurality of patterns, and the plurality of patterns may be disposed to be spaced apart from each other such that at least a portion of the conductive organic layer EOL is exposed. The organic pattern OSL may have a line shape or a dot shape. In one embodiment, the organic pattern OSL may include a plurality of line patterns as shown in (a) and (b) of FIG. 6. The plurality of line patterns may be disposed to be spaced apart from each other such that at least a portion of the conductive organic layer EOL disposed therebelow may be exposed. The plurality of line patterns may have at least one of a width and a spaced distance that is different for each of the subpixels depending on a limit current of the driving transistor TFT of each of the plurality of subpixels.

In another embodiment, the organic pattern OSL may include a plurality of dot patterns as shown in (c) and (d) of FIG. 6. The plurality of dot patterns may be disposed to be spaced apart from each other to expose at least a portion of the conductive organic layer EOL disposed therebelow.

At least one of a width and a spaced distance of the organic pattern OSL may be different for each subpixel depending on a selected current of the driving transistor TFT of each of the plurality of subpixels SP1, SP2, SP3 and SP4. In one embodiment, a thickness of the organic pattern OSL may be different for each subpixel depending on the selected current of the driving transistor TFT of each of the plurality of subpixels SP1, SP2, SP3 and SP4. This will be described later in detail.

A planarization layer PLN for planarizing a step difference due to the driving transistor TFT may be provided over the conductive organic layer EOL and the organic pattern OSL. The planarization layer PLN may include an organic layer such as an acrylic resin, an epoxy resin, a phenolic resin, a polyamide resin and a polyimide resin.

A light emitting element, which includes a first electrode 120, an organic light emitting layer 130 and a second electrode 140, and a bank 125 may be provided over the planarization layer PLN.

The first electrode 120 may be provided over the planarization layer PLN for each of the subpixels SP1, SP2, SP3 and SP4. One first electrode 120 is provided in the first subpixel SP1, the other first electrode 120 is provided in the second subpixel SP2, another first electrode 120 is provided in the third subpixel SP3, and another first electrode 120 is provided in the fourth subpixel SP4. The first electrode 120 may be not provided in the transmission area TA.

The first electrode 120 may include a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti). The first electrode 120 may be an anode electrode.

The first electrode 120 may be electrically connected to the conductive organic layer EOL through a contact hole passing through the planarization layer PLN, and the conductive organic layer EOL may be electrically connected to the source electrode SE or the drain electrode DE of the driving transistor TFT. As a result, the first electrode 120 may be electrically connected to the driving transistor TFT to receive the data current from the driving transistor TFT.

In more detail, the first electrode 120 provided in each of the plurality of subpixels SP1, SP2, SP3 and SP4 may include a plurality of divided electrodes 121 and 122 and an anode connection electrode ACE.

The plurality of divided electrodes 121 and 122 may be provided over the planarization layer PLN. The plurality of divided electrodes 121 and 122 may include two or more, and may be disposed to be spaced apart from each other in the first direction (X-axis direction) or the second direction (Y-axis direction). As an example, the first electrode 120 may include, but is not limited to, a first divided electrode 121 and a second divided electrode 122 as shown in FIG. 2. The plurality of divided electrodes 121 and 122 may include two or more. It should be understood that "divided electrode" includes the meaning of "electrode portion," and that the act of dividing is not required by the term "divided electrode."

As the number of the divided electrodes 121 and 122 included in one first electrode 120 is smaller, an aperture ratio may be increased, but a size of an area that becomes a dark spot due to particles may be increased so that yield may be reduced. On the other hand, as the number of the divided electrodes 121 and 122 included in one first electrode 120 is increased, the aperture ratio may be reduced, but the size of the area that becomes a dark spot due to particles may be reduced to reduce yield.

Hereinafter, for convenience of description, the following description will be based on that the first electrode 120 includes a first divided electrode 121 and a second divided electrode 122.

The first divided electrodes 121 may be disposed in the first divided light emission areas EA11, EA21, EA31 and EA41, and the second divided electrodes 122 may be disposed in the second divided light emission areas EA12, EA22, EA32 and EA42. The first and second divided electrodes 121 and 122 may be disposed to be spaced apart from each other in the same layer.

The anode connection electrode ACE is to connect the first divided electrode 121 and the second divided electrode 122 to the driving transistor TFT, and may include a first anode connection portion ACE1 and a second anode connection portion ACE2 as shown in FIG. 2.

The first anode connection portion ACE1 may be provided between the transmissive area TA and the first divided electrode 121. One end of the first anode connection portion ACE1 may be connected to the first divided electrode 121, and the other end thereof may be connected to the conductive organic layer EOL. The first anode connection portion ACE1 may be extended from the first divided electrode 121 toward the transmissive area TA as much as a predetermined or selected length at one end. The first anode connection portion ACE1 may be extended to be bent so that at least a portion thereof may overlap the conductive organic layer EOL at the other end. At least a portion of the first anode connection portion ACE1 may overlap the conductive organic layer EOL at the other end, and may be electrically connected to the conductive organic layer EOL through a first contact hole CH1.

The second anode connection portion ACE2 may be provided between the transmissive area TA and the second divided electrode 122. One end of the second anode connection portion ACE2 may be connected to the second divided electrode 122, and the other end thereof may be connected to the conductive organic layer EOL. The second anode connection portion ACE2 may be extended from the second divided electrode 122 toward the transmissive area TA as much as a predetermined or selected length at one end. The second anode connection portion ACE2 may be extended to be bent so that at least a portion thereof may overlap the conductive organic layer EOL at the other end. At least a portion of the second anode connection portion ACE2 may overlap the conductive organic layer EOL at the other end, and may be electrically connected to the conductive organic layer EOL through a second contact hole CH2.

The first anode connection portion ACE1 may be integrally formed with the first divided electrode 121 in the same layer as the first divided electrode 121, and the second anode connection portion ACE2 may be integrally formed with the second divided electrode 122 in the same layer as the second divided electrode 122. An area in which the first anode connection portion ACE1 and the second anode connection portion ACE2 may be the non-transmissive area NTA, but is not limited thereto. In another embodiment, the first anode connection portion ACE1 and the second anode connection portion ACE2 may be made of a transparent conductive material. In this case, an area in which the first anode connection portion ACE1 and the second anode connection portion ACE2 are formed may be the transmissive area TA.

In the transparent display panel 110 according to one embodiment of the present disclosure, the driving transistor TFT may further include a transistor connection electrode TCE for connecting the driving transistor TFT to the divided electrodes 121 and 122 of the first electrode 120.

One end of the transistor connection electrode TCE may be connected to the source electrode SE or the drain electrode DE of the driving transistor TFT, and the other end thereof may be connected to the first divided electrode 121 and the second divided electrode 122 through the conductive organic layer EOL. The transistor connection electrode TCE may be extended from the source electrode SE or the drain electrode DE of the driving transistor TFT toward the transmissive area TA as much as a predetermined or selected length at one end. The transistor connection electrode TCE may overlap at least a portion of the first anode connection portion ACE1 connected to the first divided electrode 121 and at least a portion of the second anode connection portion ACE2 connected to the second divided electrode 122 at the other end.

At least a portion of the transistor connection electrode TCE may be provided to be in contact with the conductive organic layer EOL. The transistor connection electrode TCE may be directly provided with the conductive organic layer EOL on at least a portion of an upper surface thereof. The conductive organic layer EOL provided on the upper surface at the other end of the transistor connection electrode TCE may be connected to the first divided electrode 121 through the first contact hole CH1, and may be connected to the second divided electrode 122 through the second contact hole CH2. Therefore, the transistor connection electrode TCE may be electrically connected to the first divided electrode 121 and the second divided electrode 122 through the conductive organic layer EOL provided on the upper surface thereof.

The transparent display panel 110 according to one embodiment of the present disclosure is characterized in that the first electrode 120 comprised of the first divided electrode 121 and the second divided electrode 122 is connected to the driving transistor TFT through the conductive organic layer EOL. In this case, in the transparent display panel 110 according to one embodiment of the present disclosure, even though particles occur in any one of the first divided electrode 121 and the second divided electrode 122, only an area in which the corresponding divided electrode is provided may become a dark spot definitely, and the other divided electrode may normally operate.

In detail, in the display panel 110 according to one embodiment of the present disclosure, particles may occur in any one 121 of the first divided electrode 121 and the second divided electrode 122. In this case, in the display panel 110 according to one embodiment of the present disclosure, a short may occur between the first divided electrode 121 and the second electrode 140 in the area in which the particles are positioned. When an aging signal is applied to the light emitting element during an aging process, a current may be concentrated on the area where the first divided electrode 121 and the second electrode 140 are short-circuited, whereby significant heat may be generated by joule heating. In this case, the aging process may be performed to prevent quality or reliability from being deteriorated before the product is released. The aging signal may correspond to a power source or signal applied to the light emitting element such that a predetermined or selected current flows in the light emitting element, and may be, for example, a reverse bias voltage.

In the transparent display panel 110 according to one embodiment of the present disclosure, when sufficient heat is generated in the area in which the particles are positioned, the light emitting layer 130 and the second electrode 140 are melted so that the divided electrode 121 and the second electrode 140 may be insulated from each other.

However, when sufficient heat is not generated in the area in which the particles are positioned, the light emitting layer 130 and the second electrode 140 are not melted, and the divided electrode 121 and the second electrode 140 may be short-circuited. In this case, light may not be emitted in the divided electrode, in which particles occur, and in the area in which the other divided electrodes 122 are provided.

In the transparent display panel 110 according to one embodiment of the present disclosure, the divided electrode 121 in which the particles occur and the driving transistor TFT may be disconnected from each other, so that light may be emitted in the area in which the divided electrode 122 in which the particles do not occur is provided. To this end, in the transparent display panel 110 according to one embodiment of the present disclosure, the first divided electrode 121 and the second divided electrode 122 are not directly connected to the driving transistor TFT, and may be connected to the driving transistor TFT through the conductive organic layer EOL.

Since the source electrode SE or the drain electrode DE of the driving transistor TFT is made of a metal material and has a high melting point, it is difficult to melt the source electrode SE or the drain electrode DE of the driving transistor TFT. Therefore, one of methods of disconnecting the divided electrode 121 in which particles occur from the driving transistor TFT is to cut the source electrode SE or the drain electrode DE of the driving transistor TFT by using a laser.

However, according to this method, other lines and peripheral elements may be damaged by the laser, and in order to prevent the lines and the peripheral elements from being damaged due to the laser, the lines and the circuit elements need to be designed so as not to overlap a laser cutting area. In this case, since the lines and the circuit elements should be designed in a limited space, a size of the light emission area EA or the transmissive area TA may be reduced to make sure of the laser cutting area. In addition, since a laser cutting process of searching for the divided electrode in which particles occur and disconnecting the divided electrode in which particles occur from the driving transistor TFT should be additionally provided, the process becomes complicated and the process time may be lengthened.

In order to solve the above-mentioned problems, the transparent display panel 110 according to one embodiment of the present disclosure may have a structure in which the divided electrode 121 in which particles occur and the driving transistor TFT may be electrically separated from each other without laser cutting.

In detail, in the transparent display panel 110 according to one embodiment of the present disclosure, as shown in FIG. 3, the first divided electrode 121 and the second divided electrode 122 may not be directly connected to the driving transistor TFT, and may be connected to the driving transistor TFT through the conductive organic layer EOL.

The first contact hole CH1 may expose at least a portion of the conductive organic layer EOL and at least a portion of the organic pattern OSL by passing through the planarization layer PLN. The first divided electrode 121 may include a first contact area CA1 that is in contact with at least a portion of the conductive organic layer EOL and at least a portion of the organic pattern OSL, which are exposed by the first contact hole CH1.

The second contact hole CH2 may expose at least a portion of the conductive organic layer EOL and at least a portion of the organic pattern OSL by passing through the planarization layer PLN. The second divided electrode 122 may include a second contact area CA2 that is in contact with at least a portion of the conductive organic layer EOL and at least a portion of the organic pattern OSL, which are exposed by the second contact hole CH2. A size of the conductive organic layer EOL exposed by the first contact hole CH1 and the second contact hole CH2 may be different for each of a plurality of subpixels depending on a limit current of the driving transistor TFT of each of the plurality of subpixels.

When particles occur in any one of the first divided electrode 121 and the second divided electrode 122, a current is concentrated on the divided electrodes in which particles occur, whereby a large amount of current flows even in the contact area CA. For example, when particles occur in the first divided electrode 121, the current is concentrated on the first divided electrode 121, whereby a large amount of current flows even in the first contact area CA1. Therefore, significant heat may be generated in the first contact area CA1 by Joule heating.

The conductive organic layer EOL is an organic material having conductivity, and has a melting point lower than that of a metal material. Therefore, the conductive organic layer EOL may be melted at a temperature lower than that of the source electrode SE or the drain electrode DE of the driving transistor TFT. When sufficient heat is generated in the first contact area CA1 of the first divided electrode 121 in which particles occur, the conductive organic layer EOL and the organic pattern OSL, which are disposed in the first contact area CA1, may be melted as shown in FIG. 5 to electrically separate the first divided electrode 121 from the transistor connection electrode TCE. Therefore, the first contact area CA1 may be changed to a non-contact area NCA where the first divided electrode 121 and the conductive organic layer EOL are not in contact with each other.

As a result, in the transparent display panel 110 according to one embodiment of the present disclosure, the divided electrode 121 in which particles occur and the driving transistor TFT may be electrically separated from each other without laser cutting. Therefore, in the transparent display panel 110 according to one embodiment of the present disclosure, other lines and circuit elements may be prevented from being damaged by the laser, and since a separate laser cutting process is not required, the process may be simplified and the process time may be shortened.

In addition, in the transparent display panel 110 according to one embodiment of the present disclosure, since the conductive organic layer EOL has only to be in contact with the divided electrodes 121 and 122, other lines and circuit elements may be designed to overlap the conductive organic layer EOL. Therefore, in the transparent display panel 110 according to one embodiment of the present disclosure, the size of the light emission area EA or the transmissive area TA may not be reduced when the conductive organic layer EOL is provided. That is, in the transparent display panel 110 according to one embodiment of the present disclosure, the conductive organic layer EOL may be provided without reduction of an aperture ratio and reduction of transmittance.

Also, in the transparent display panel 110 according to one embodiment of the present disclosure, when particles occur, the light emitting layer 130 and the second electrode 140 of the area in which the particles are positioned may be melted or sublimated by Joule heating, so that primary aging may be performed. In the transparent display panel 110 according to one embodiment of the present disclosure, only the area in which particles occur may locally be a dark spot. However, the primary aging may be performed even though sufficient heat is not generated in the area in which the particles are positioned or the divided electrode and the second electrode 140 may be still electrically connected to each other without being insulated from each other depending on the state that the light emitting layer 130 and the second electrode 140 are melted.

In this case, in the transparent display panel 110 according to one embodiment of the present disclosure, as the current is still concentrated on the divided electrode in which particles occur, the conductive organic layer EOL and the organic pattern OSL of the contact area CA may be melted or sublimated by Joule heating so that secondary aging may be performed. As a result, in the transparent display panel 110 according to one embodiment of the present disclosure, only a portion of the subpixel, in which particles occur, may definitely become a dark spot, and all of the subpixels may be prevented from being dark spots.

Meanwhile, in the transparent display panel 110 according to one embodiment of the present disclosure, a contact size of the conductive organic layer EOL and the first electrode 120, which are provided over the upper surface of the transistor connection electrode TCE, may be formed to be different for each subpixel. In this case, the contact size of the conductive organic layer EOL and the first electrode 120 may represent a total sum of sizes of the conductive organic layer EOL that is in contact with the first anode connection portion ACE1 and the second anode connection portion ACE2, which are respectively extended from the divided electrodes 121 and 122, in the contact area CA.

In detail, in the transparent display panel 110 according to one embodiment of the present disclosure, the contact size of the conductive organic layer EOL and the first electrode 120 may be provided differently for each subpixel in consideration of the size of the current supplied from the driving transistor TFT.

A selected current for each of the first to fourth subpixels SP1, SP2, SP3 and SP4 may be different depending on a color of light that is emitted. The driving transistor TFT provided in each of the first to fourth subpixels SP1, SP2, SP3 and SP4 may be sized in consideration of the selected current. For example, the current selected for the first subpixel SP1 emitting red light among the first to fourth subpixels SP1, SP2, SP3 and SP4 may be the largest. In this case, the driving transistor TFT connected to the first electrode 120 of the first subpixel SP1 may have a size larger than that of the driving transistor TFT of each of the second to fourth subpixels SP2, SP3 and SP4, thereby having a high limit current. For another example, the current selected for the third subpixel SP3 emitting blue light among the first to fourth subpixels SP1, SP2, SP3 and SP4 may be the smallest. In this case, the driving transistor TFT connected to the first electrode 120 of the third subpixel SP3 may have a size smaller than that of the driving transistor TFT of each of the first, second and fourth subpixels SP1, SP2 and SP4, thereby having a low limit current.

The first electrode 120 provided in each of the first to fourth subpixels SP1, SP2, SP3 and SP4 may have a variable contact resistance with the conductive organic layer EOL depending on the sizes of the driving transistors TFT. When the size of the driving transistor TFT is large, the current supplied from the driving transistor TFT is large, so that the contact resistance between the first electrode 120 and the conductive organic layer EOL may be large. On the other hand, when the size of the driving transistor TFT is small, the current supplied from the driving transistor TFT is small, so that the contact resistance between the first electrode 120 and the conductive organic layer EOL may be small.

In the transparent display panel 110 according to one embodiment of the present disclosure, the contact size between the conductive organic layer EOL and the first electrode 120 may be adjusted, so that the contact resistance between the conductive organic layer EOL and the first electrode 120 may be adjusted. As a result, in the transparent display panel 110 according to one embodiment of the present disclosure, the contact resistance between the first electrode 120 and the conductive organic layer EOL may be similar in the first to fourth subpixels SP1, SP2, SP3 and SP4.

For example, the driving transistor TFT connected to the first electrode 120 of the first subpixel SP1 may be the largest, the driving transistor TFT connected to the first electrode 120 of the second subpixel SP2 may be the second largest, the driving transistor TFT connected to the first electrode 120 of the fourth subpixel SP4 may be the third largest, and the driving transistor TFT connected to the first electrode 120 of the third subpixel SP3 may be the smallest. For example, the driving transistor TFT connected to the first electrode 120 of the red subpixel SP1 may be largest, the driving transistor TFT connected to the first electrode 120 of the green subpixel SP2 may be second largest, the driving transistor TFT connected to the first electrode 120 of the white subpixel SP4 may be the third largest, and the driving transistor TFT connected to the first electrode 120 of the blue subpixel SP3 may be the smallest.

In this case, the first electrode 120 of the third subpixel SP3 may have a contact size with the conductive organic layer EOL, which is smaller than that of the first electrode 120 of the fourth subpixel SP4 with the conductive organic layer EOL. The current applied to the first electrode 120 of the third subpixel SP3 may be smaller than that applied to the first electrode 120 of the fourth subpixel SP4. Therefore, the contact size between the first electrode 120 of the third subpixel SP3 and the conductive organic layer EOL is smaller than that between the first electrode 120 of the fourth subpixel SP4 and the conductive organic layer EOL, whereby the contact resistance between the first electrode 120 of the third subpixel SP3 and the conductive organic layer EOL may be increased.

In addition, the first electrode 120 of the fourth subpixel SP4 may have a contact size with the conductive organic layer EOL, which is smaller than that of the first electrode 120 of the second subpixel SP2 with the conductive organic layer EOL. The current applied to the first electrode 120 of the fourth subpixel SP4 may be smaller than that applied to the first electrode 120 of the second subpixel SP2. Therefore, the contact size between the first electrode 120 of the fourth subpixel SP4 and the conductive organic layer EOL is smaller than that between the first electrode 120 of the second subpixel SP2 and the conductive organic layer EOL, whereby the contact resistance between the first electrode 120 of the fourth subpixel SP4 and the conductive organic layer EOL may be increased.

In addition, the first electrode 120 of the second subpixel SP2 may have a contact size with the conductive organic layer EOL, which is smaller than that of the first electrode 120 of the first subpixel SP1 with the conductive organic layer EOL. The current applied to the first electrode 120 of the second subpixel SP2 may be smaller than that applied to the first electrode 120 of the first subpixel SP1. Therefore, the contact size between the first electrode 120 of the second subpixel SP2 and the conductive organic layer EOL is smaller than that between the first electrode 120 of the first subpixel SP1 and the conductive organic layer EOL, whereby the contact resistance between the first electrode 120 of the second subpixel SP2 and the conductive organic layer EOL may be increased.

As a result, the contact size between the first electrode 120 and the conductive organic layer EOL in the third subpixel SP3 may be the smallest, the contact size between the first electrode 120 and the conductive organic layer EOL in the fourth subpixel SP4 may be the second smallest, the contact size between the first electrode 120 and the conductive organic layer EOL in the second subpixel SP2 may be third smallest, and the contact size between the first electrode 120 and the conductive organic layer EOL in the first subpixel SP1 may be the largest. For example, the contact size between the first electrode 120 and the conductive organic layer EOL in the blue subpixel SP3 may be the smallest, the contact size between the first electrode 120 and the conductive organic layer EOL in the white subpixel SP4 may be second smallest, the contact size between the first electrode 120 and the conductive organic layer EOL in the green subpixel SP2 may be third smallest, and the contact size between the first electrode 120 and the conductive organic layer EOL in the red subpixel SP1 may be the largest.

In the transparent display panel 110 according to one embodiment of the present disclosure described as above, when the current applied from the driving transistor TFT is small, the contact size between the first electrode 120 and the conductive organic layer EOL connected to the corresponding driving transistor TFT is reduced, so that the contact resistance between the conductive organic layer EOL and the first electrode 120 may be increased. As a result, in the transparent display panel 110 according to one embodiment of the present disclosure, the conductive organic layer EOL may be melted or sublimated in the contact area CA when particles occur, so that that the first electrode 120 and the driving transistor TFT may be electrically separated from each other.

Meanwhile, in the transparent display panel 110 according to one embodiment of the present disclosure, the contact size between the conductive organic layer EOL and the first electrode 120 in each of the subpixels SP1, SP2, SP3 and SP4 may be adjusted based on at least one of the width and the spaced distance of the organic pattern OSL that is in contact with the first electrode 120.

In one embodiment of the present disclosure, the organic pattern OSL that is in contact with the first electrode 120 may have a different width for each of the subpixels SP1, SP2, SP3 and SP4. The organic pattern OSL may have a width that is varied depending on a limit current of the driving transistor TFT of each of the subpixels SP1, SP2, SP3 and SP4.

When the limit current of the driving transistor TFT of each of the subpixels SP1, SP2, SP3 and SP4 is low, the organic pattern OSL may have a wide width to reduce the contact size between the conductive organic layer EOL and the first electrode 120 in the contact area CA. For example, the driving transistor TFT provided in the third subpixel SP3 may have a limit current lower than that of the driving transistor TFT provided in the first subpixel SP1. In this case, the contact size of the first electrode 120, which is provided in the third subpixel SP3, with the conductive organic layer EOL is provided to be smaller than that of the first electrode 120, which is provided in the first subpixel SP1, with the conductive organic layer EOL, whereby the contact resistance of the first electrode 120, which is provided in the third subpixel SP3, with the conductive organic layer EOL may be increased.

To this end, the organic pattern OSL, which is in contact with the first electrode 120 provided in the third subpixel SP3, may have first widths W1 and W3 as shown in (a) and (c) of FIG. 6, and the organic pattern OSL, which is in contact with the first electrode 120 provided in the first subpixel SP1, may have second widths W2 and W4 that are smaller than the first widths W1 and W3 as shown in (b) and (d) of FIG. 6. At this time, spaced distances d1 and d3 of the organic pattern OSL that is in contact with the first electrode 120 provided in the third subpixel SP3 may be the same as spaced distances d2 and d4 of the organic pattern OSL that is in contact with the first electrode 120 provided in the first subpixel SP1.

As a result, when the contact area CA is the same, a smaller size of the conductive organic layer EOL may be exposed without being covered by the organic pattern OSL in the contact area CA of the first electrode 120 provided in the third subpixel SP3. That is, a contact size of the first electrode 120, which is provided in the third subpixel SP3, with the conductive organic layer EOL may be smaller than that of the first electrode 120, which is provided in the first subpixel SP1, with the conductive organic layer EOL. Therefore, even though the driving transistor TFT provided in the third subpixel SP3 has a low limit current, the contact resistance between the first electrode 120 provided in the third subpixel SP3 and the conductive organic layer EOL may be increased, whereby heat sufficient to melt or sublimate the conductive organic layer EOL and the organic pattern OSL may be generated when the first electrode 120 and the second electrode 140 are shirt-circuited.

In another embodiment, the spaced distance of the organic pattern OSL that is in contact with the first electrode 120 may be different for each of the subpixels SP1, SP2, SP3 and SP4. The spaced distance of the organic pattern OSL may be varied depending on the limit current of the driving transistor TFT of each of the subpixels SP1, SP2, SP3 and SP4.

When the limit current of the driving transistor TFT of each of the subpixels SP1, SP2, SP3 and SP4 is low, the organic pattern OSL may have a small spaced distance to reduce the contact size between the conductive organic layer EOL and the first electrode 120 in the contact area CA. For example, the driving transistor TFT provided in the third subpixel SP3 may have a limit current lower than that of the driving transistor TFT provided in the first subpixel SP1. In this case, the contact size of the first electrode 120, which is provided in the third subpixel SP3, with the conductive organic layer EOL is provided to be smaller than that of the first electrode 120, which is provided in the first subpixel SP1, with the conductive organic layer EOL, whereby the contact resistance of the first electrode 120 provided in the third subpixel SP3 with the conductive organic layer EOL may be increased.

To this end, the organic pattern OSL that is in contact with the first electrode 120 provided in the third subpixel SP3 may have a first spaced distance, and the organic pattern OSL that is in contact with the first electrode 120 provided in the first subpixel SP1 may have a second spaced distance greater than the first spaced distance. At this time, a width of the organic pattern OSL that is in contact with the first electrode 120 provided in the third subpixel SP3 may be the same as that of the organic pattern OSL that is in contact with the first electrode 120 provided in the first subpixel SP1.

As a result, when the contact area CA is the same, a smaller size of the conductive organic layer EOL may be exposed without being covered by the organic pattern OSL in the contact area CA of the first electrode 120 provided in the third subpixel SP3. That is, a contact size of the first electrode 120, which is provided in the third subpixel SP3, with the conductive organic layer EOL may be smaller than that of the first electrode 120, which is provided in the first subpixel SP1, with the conductive organic layer EOL. Therefore, even though the driving transistor TFT provided in the third subpixel SP3 has a low limit current, the contact resistance between the first electrode 120 provided in the third subpixel SP3 and the conductive organic layer EOL may be increased, whereby heat sufficient to melt or sublimate the conductive organic layer EOL and the organic pattern OSL may be generated when the first electrode 120 and the second electrode 140 are shirt-circuited.

In still another embodiment, the width and the spaced distance of the organic pattern OSL that is in contact with the first electrode 120 may be different for each of the subpixels SP1, SP2, SP3 and SP4. The width and the spaced distance of the organic pattern OSL may be varied depending on the limit current of the driving transistor TFT of each of the subpixels SP1, SP2, SP3 and SP4. When the limit current of the driving transistor TFT of each of the subpixels SP1, SP2, SP3 and SP4 is low, the width and the spaced distance of the organic pattern OSL may be appropriately designed such that the contact size between the conductive organic layer EOL and the first electrode 120 is reduced in the contact area CA.

In the transparent display panel 110 according to one embodiment of the present disclosure, the contact size between the first electrode 120 and the conductive organic layer EOL may be adjusted in consideration of the limit current of the driving transistor TFT of each of the subpixels SP1, SP2, SP3 and SP4. Therefore, in the transparent display panel 110 according to one embodiment of the present disclosure, even though the driving transistor TFT has a low limit current, the first electrode 120 and the driving transistor TFT may be electrically separated from each other in the contact area CA when particles occur.

In the transparent display panel 110 according to one embodiment of the present disclosure, even though particles occur, only an area in which the particles are positioned becomes a dark spot locally, or only a corresponding divided electrode of the plurality of divided electrodes 121 and 122 is short-circuited, whereby a light loss rate due to occurrence of the dark spot may be reduced.

A bank 125 may be provided over the planarization layer PLN. In addition, the bank 125 may be provided between the first electrodes 120 provided in the first to fourth subpixels SP1, SP2, SP3 and SP4, and may be also provided over the first anode connection portion ACE1, the second anode connection portion ACE2, the first contact hole CH1 and the second contact hole CH2. The bank 125 may be provided to at least partially cover an edge of each of the first electrodes 120 and expose a portion of each of the first electrodes 120. Therefore, the bank 125 may prevent light emitting efficiency from being deteriorated due to the current concentrated on each end of the first electrodes 120.

The bank 125 may be adjacent light emission areas EA11, EA12, EA21, EA22, EA31, EA32, EA41 and EA42 of each of the subpixels SP1, SP2, SP3 and SP4. In each of the subpixels SP1, SP2, SP3, SP4, the light emission areas EA11, EA12, EA21, EA22, EA31, EA32, EA41 and EA42 refer to areas in which the first electrode 120, the organic light emitting layer 130 and the second electrode 140 are sequentially stacked so that holes from the first electrode 120 and electrons from the second electrode 140 are combined with each other in the organic light emitting layer 130 to emit light. In this case, the area in which the bank 125 is provided in the non-transmissive area NTA does not emit light, and thus becomes the non-light emission area, and the areas in which the bank 125 is not provided and the first electrode 120 is exposed may become the light emission areas EA11, EA12, EA21, EA22, EA31, EA32, EA41 and EA42.

The bank 125 may include an organic layer such as an acrylic resin, an epoxy resin, a phenolic resin, a polyamide resin, and a polyimide resin.

The organic light emitting layer 130 may be disposed over the first electrode 120. The organic light emitting layer 130 may include a hole transporting layer, a light emitting layer and an electron transporting layer. In this case, when a voltage is applied to the first electrode 120 and the second electrode 140, holes and electrons move to the light emitting layer through the hole transporting layer and the electron transporting layer, respectively and are combined with each other in the light emitting layer to emit light.

In one embodiment, the organic light emitting layer 130 may be a common layer commonly provided in the subpixels SP1, SP2, SP3 and SP4. In this case, the light emitting layer may be a white light emitting layer for emitting white light.

In another embodiment, the light emitting layer of the organic light emitting layer 130 may be provided for each of the subpixels SP1, SP2, SP3 and SP4. For example, a red light emitting layer for emitting red light may be provided in the first subpixel SP1, a green light emitting layer for emitting green light may be provided in the second subpixel SP2, a blue light emitting layer for emitting blue light may be provided in the third subpixel SP3, and a white light emitting layer for emitting white light may be provided in the fourth subpixel SP4. In this case, the light emitting layer of the organic light emitting layer 130 may be not provided in the transmission area TA.

The second electrode 140 may be provided over an organic light emitting layer 130 and a bank 125. The second electrode 140 may be provided in the transmissive area TA as well as the non-transmissive area NTA that includes the emission area EA, but is not limited thereto. The second electrode 140 may be provided only in the non-transmissive area NTA that includes the emission area EA, but may not be provided in the transmissive area TA to improve transmittance.

The second electrode 140 may be a common layer commonly provided in the subpixels SP1, SP2, SP3 and SP4 to apply the same voltage. The second electrode 140 may include a conductive material that may transmit light. For example, the second electrode 140 may include a low resistance metal material, for example, Ag, or alloy of Mg and Ag.

An encapsulation layer 150 may be provided over the light emitting diodes. The encapsulation layer 150 may be provided over the second electrode 140 to overlay the second electrode 140. The encapsulation layer 150 serves to prevent oxygen or water from being permeated into the organic light emitting layer 130 and the second electrode 140. To this end, the encapsulation layer 150 may include at least one inorganic layer and at least one organic layer.

Meanwhile, although not shown in figures, a capping layer may additionally be provided between the second electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer (not shown). At this time, the adhesive layer (not shown) may be an optically clear resin (OCR) layer or an optically clear adhesive (OCA) film.

The color filter CF may be provided to be patterned for each of the subpixels SP1, SP2, SP3 and SP4. In detail, the color filter CF may include a first color filter, a second color filter, and a third color filter. The first color filter may be disposed to correspond to the emission area EA1 of the first subpixel SP1, and may be a red color filter that transmits red light. The second color filter may be disposed to correspond to the emission area EA2 of the second subpixel SP2, and may be a green color filter that transmits green light. The third color filter may be disposed to correspond to the emission area EA3 of the third subpixel SP3, and may be a blue color filter that transmits blue light. In an embodiment, the color filter CF may further include a fourth color filter. The fourth color filter may be disposed to correspond to the emission area EA4 of the fourth subpixel SP4 and may be a white color filter that transmits white light. The white color filter may include a transparent organic material that transmits white light.

A black matrix (not shown) may be provided among color filters CF. The black matrix (not shown) may be provided among the subpixels SP1, SP2, SP3 and SP4 to prevent color mixture from occurring among the subpixels SP1, SP2, SP3 and SP4 adjacent to one another.

Meanwhile, the black matrix (not shown) may be provided between the color filter CF and the transmission area TA. The black matrix (not shown) is provided between the transmission area TA and the plurality of subpixels SP1, SP2, SP3 and SP4 to prevent light emitted from each of the plurality of subpixels SP1, SP2, SP3 and SP4 from proceeding to the transmission area TA.

The black matrix (not shown) may include a material that absorbs light, for example, a black dye that fully absorbs light of a visible light wavelength range.

Although FIG. 3 to FIG. 6 show that the organic pattern OSL is provided in the area except for the first contact area CA1 and the second contact area CA2, the present disclosure is not limited thereto. In another embodiment, the organic pattern OSL may be provided to at least partially overlap only the first contact area CA1 and the second contact area CA2 as shown in FIG. 7. The organic pattern OSL has only to adjust the contact size between the conductive organic layer EOL and the first electrode 120 by being overlapped with the first contact hole CH1 and the second contact hole CH2, and thus may be provided only in the area overlapped with the first contact hole CH1 and the second contact hole CH2.

In FIGS. 3 to 6, the conductive organic layer EOL is shown as being provided directly on the upper surface of the transistor connection electrode TCE, or may be directly provided on an upper surface of the source electrode SE or the drain electrode DE, but is not limited thereto. In another embodiment, the conductive organic layer EOL may be spaced apart from the transistor connection electrode TCE of the driving transistor TFT with at least one insulating layer interposed therebetween as shown in FIG. 8. At least one insulating layer, for example, a passivation layer PAS, may be further provided between the conductive organic layer EOL and the driving transistor TFT. The conductive organic layer EOL may be connected to the transistor connection electrode TCE of the driving transistor TFT, or source electrode SE or drain electrode DE of the driving transistor TFT through a fourth contact hole CH4 passing through the passivation layer PAS.

In the transparent display panel 110 shown in FIG. 8, at least one insulating layer may be provided between the conductive organic layer EOL and the driving transistor TFT, so that the driving transistor TFT may be prevented from being damaged due to heat generated in the contact area CA of the divided electrode in which particles occur.

In FIGS. 3 to 6, the conductive organic layer EOL and the organic pattern OSL are shown as being separate elements made of their respective materials different from each other, but are not limited thereto. In another embodiment, the conductive organic layer EOL and the organic pattern OSL may be integrally formed of the same material. In this case, as shown in FIG. 9, the conductive organic layer EOL may include a flat portion EOL1 provided over the transistor connection electrode TCE and an uneven pattern portion EOL2 provided in the uneven pattern over the flat portion EOL1.

In the transparent display panel 110 shown in FIG. 9, the contact size between the conductive organic layer EOL and the first electrode 120 in each of the subpixels SP1, SP2, SP3 and SP4 may be adjusted based on at least one of a width and a spaced distance of the uneven pattern portion EOL2.

In one embodiment, the uneven pattern portion EOL2 of the conductive organic layer EOL may have a different width for each of the subpixels SP1, SP2, SP3 and SP4. The uneven pattern portion EOL2 may have a width that is varied depending on the limit current of the driving transistor of each of the subpixels SP1, SP2, SP3 and SP4.

When the limit current of the driving transistor TFT of the subpixels SP1, SP2, SP3 and SP4 is low, the uneven pattern portion EOL2 may have a wide width so that the conductive organic layer EOL may have a small contact size with the first electrode 120 in the contact area CA. For example, the driving transistor TFT provided in the third subpixel SP3 may have a limit current lower than that of the driving transistor TFT provided in the first subpixel SP1. In this case, the first electrode 120 provided in the third subpixel SP3 may have a contact size with the conductive organic layer EOL, which is smaller than that of the first electrode 120, which is provided in the first subpixel SP1, with the conductive organic layer EOL, whereby the contact resistance between the first electrode and the conductive organic layer EOL may be increased.

To this end, the uneven pattern portion EOL2, which is in contact with the first electrode 120 provided in the third subpixel SP3, may have a width greater than that of the uneven pattern portion EOL2 that is in contact with the first electrode 120 provided in the first subpixel SP1. At this time, the uneven pattern portion EOL2 that is in contact with the first electrode 120 provided in the third subpixel SP3 may have the same spaced distance as that of the uneven pattern portion EOL2 that is in contact with the first electrode 120 provided in the first subpixel SP1.

As a result, when the contact area CA is the same, a surface size of the conductive organic layer EOL may be reduced as the width of the uneven pattern portion EOL2 is increased, and the surface size of the conductive organic layer EOL may be increased as the width of the uneven pattern portion EOL2 is reduced. Therefore, a contact size of the first electrode 120, which is provided in the third subpixel SP3, with the conductive organic layer EOL may be smaller than that of the first electrode 120, which is provided in the first subpixel SP1, with the conductive organic layer EOL. Even though the driving transistor TFT provided in the third subpixel SP3 has a low limit current, the contact resistance between the first electrode 120 provided in the third subpixel SP3 and the conductive organic layer EOL may be increased, whereby heat sufficient to melt or sublimate the conductive organic layer EOL and the organic pattern OSL may be generated when the first electrode 120 and the second electrode 140 are shirt-circuited.

In another embodiment, the spaced distance of the uneven pattern portion EOL2 of the conductive organic layer EOL may be different for each of the subpixels SP1, SP2, SP3 and SP4. The spaced distance of the uneven pattern portions EOL2 may be varied depending on the limit current of the driving transistor TFT of each of the subpixels SP1, SP2, SP3 and SP4.

When the limit current of the driving transistor TFT of each of the subpixels SP1, SP2, SP3 and SP4 is low, the uneven pattern portion EOL2 may have a great spaced distance so that the conductive organic layer EOL may have a small contact size with the first electrode 120 in the contact area CA. For example, the driving transistor TFT provided in the third subpixel SP3 may have a limit current lower than that of the driving transistor TFT provided in the first subpixel SP1. In this case, the contact size of the first electrode 120, which is provided in the third subpixel SP3, with the conductive organic layer EOL is provided to be smaller than that of the first electrode 120, which is provided in the first subpixel SP1, with the conductive organic layer EOL, whereby the contact resistance of the first electrode 120 provided in the third subpixel SP3 with the conductive organic layer EOL may be increased.

To this end, the uneven pattern portion EOL2 that is in contact with the first electrode 120 provided in the third subpixel SP3 may have a spaced distance greater than that of the uneven pattern portion EOL2 that is in contact with the first electrode 120 provided in the first subpixel SP1. At this time, the uneven pattern portion EOL2 that is in contact with the first electrode 120 provided in the third subpixel SP3 may have the same width as that of the uneven pattern portion EOL2 that is in contact with the first electrode 120 provided in the first subpixel SP1.

As a result, when the contact area CA is the same, a surface size of the conductive organic layer EOL may be reduced as the spaced distance of the uneven pattern portion EOL2 is increased, and the surface size of the conductive organic layer EOL may be increased as the spaced distance of the uneven pattern portion EOL2 is reduced. Therefore, a contact size of the first electrode 120, which is provided in the third subpixel SP3, with the conductive organic layer EOL may be smaller than that of the first electrode 120, which is provided in the first subpixel SP1, with the conductive organic layer EOL. Even though the driving transistor TFT provided in the third subpixel SP3 has a low limit current, the contact resistance between the first electrode 120 provided in the third subpixel SP3 and the conductive organic layer EOL may be increased, whereby heat sufficient to melt or sublimate the conductive organic layer EOL and the organic pattern OSL may be generated when the first electrode 120 and the second electrode 140 are shirt-circuited.

In still another embodiment, the width and the spaced distance of the uneven pattern portion EOL2 of the conductive organic layer EOL may be different for each of the subpixels SP1, SP2, SP3 and SP4. The width and the spaced distance of the uneven pattern portion EOL2 of the conductive organic layer EOL may be varied depending on the limit current of the driving transistor TFT of each of the subpixels SP1, SP2, SP3 and SP4. When the limit current of the driving transistor TFT of each of the subpixels SP1, SP2, SP3 and SP4 is low, the width and the spaced distance of the uneven pattern portion EOL2 of the conductive organic layer EOL may be appropriately designed such that the contact size between the conductive organic layer EOL and the first electrode 120 is reduced in the contact area CA.

In the transparent display panel 110 shown in FIG. 9, the organic pattern OSL may be omitted, whereby the process of forming an organic pattern OSL may be omitted to simplify the process. Also, in the transparent display panel 110 shown in FIG. 9, the organic pattern OSL may not be provided over the conductive organic layer EOL, which has a small area, through a separate process. In the transparent display panel 110 shown in FIG. 9, the organic pattern OSL is not provided over the conductive organic layer EOL due to a process error, and the contact size between the conductive organic layer EOL and the first electrode 120 may be prevented from being increased and the contact resistance therebetween may be prevented from being lowered unlike the design.

Meanwhile, in FIGS. 3 to 6, the transistor connection electrode TCE of the driving transistor TFT is shown as being extended to the contact area CA, but is not limited thereto. In another embodiment, the transistor connection electrode TCE of the driving transistor TFT may not overlap the contact area CA as shown in FIGS. 10 and 11. In this case, the transistor connection electrode TCE of the driving transistor TFT may overlap at least a portion of the conductive organic layer EOL at the end.

At least a portion of the conductive organic layer EOL may be overlapped with and electrically connected to the transistor connection electrode TCE of the driving transistor TFT. In this case, the conductive organic layer EOL may be directly in contact with the transistor connection electrode TCE, but is not limited thereto. When at least one insulating layer is provided between the conductive organic layer EOL and the transistor connection electrode TCE, the conductive organic layer EOL may be electrically connected to the transistor connection electrode TCE through a contact hole passing through at least one insulating layer.

In addition, the conductive organic layer EOL may be extended from an area overlapped with the transistor connection electrode TCE as much as a predetermined or selected length in the direction toward the transmissive area TA. The conductive organic layer EOL may at least partially overlap the first anode connection portion ACE1 and the second anode connection portion ACE2 between the transmissive area TA and the subpixels SP1, SP2, SP3 and SP4, so that the conductive organic layer EOL may be connected to the first anode connection portion ACE1 through the first contact hole CH1 and connected to the second anode connection portion ACE2 through the second contact hole CH2.

In the transparent display panel 110 shown in FIGS. 10 and 11, the transistor connection electrode TCE of the driving transistor TFT is provided so as not to overlap the contact area CA, whereby transmittance loss due to the transistor connection electrode TCE may be avoided. Since the transistor connection electrode TCE of the driving transistor TFT is made of a metal material and thus has low transmittance, transmittance loss may occur due to the transistor connection electrode TCE when the transistor connection electrode TCE overlaps the contact area CA. On the other hand, since the conductive organic layer EOL is made of an organic material and thus has high transmittance, transmittance loss may hardly occur even though the conductive organic layer EOL is provided in the contact area CA.

In FIG. 2 to FIG. 11, the divided electrodes 121 and 122 of the first electrode 120 are shown as being connected to the driving transistor TFT through the anode connection electrode ACE protruded in the direction toward the transmissive area TA, but are not limited thereto.

In another embodiment, the divided electrodes 121 and 122 of the first electrode 120 may be connected to the driving transistor TFT through the conductive organic layer EOL provided between the divided electrodes 121 and 122 without a separate anode connection electrode ACE. Hereinafter, this will be described in detail with reference to FIGS. 12 to 14.

Figure 12:
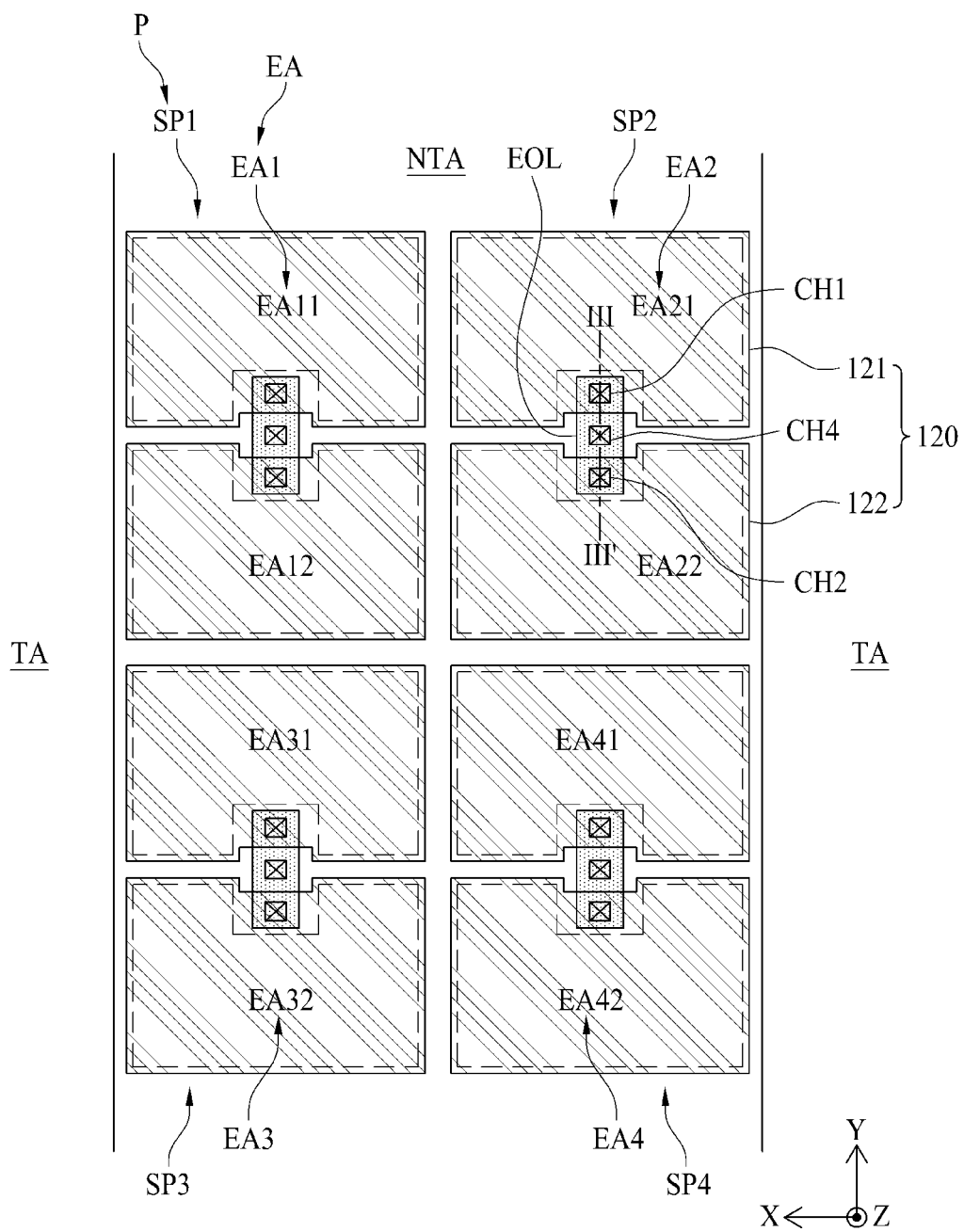
FIG. 12 is a view illustrating another example of a pixel of a transparent display panel shown in FIG. 1.
Figure 13:
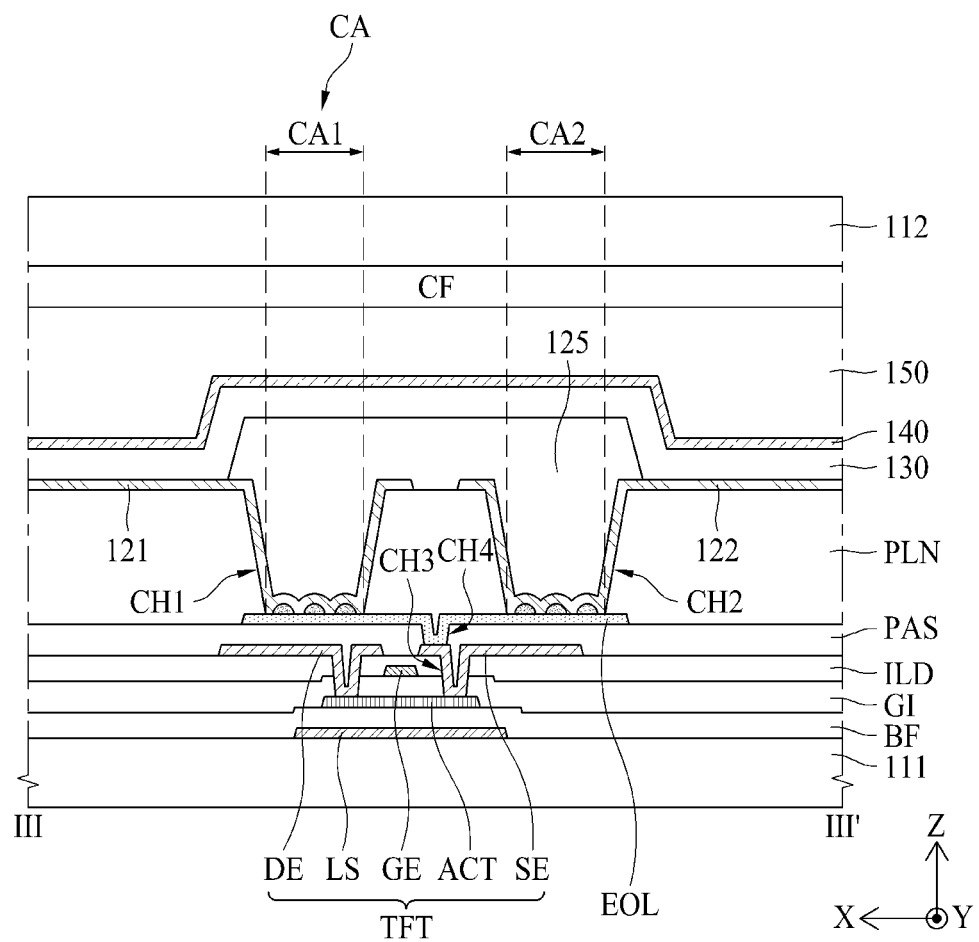
FIG. 13 is a cross-sectional view illustrating an example of line of FIG. 12.
Figure 14:
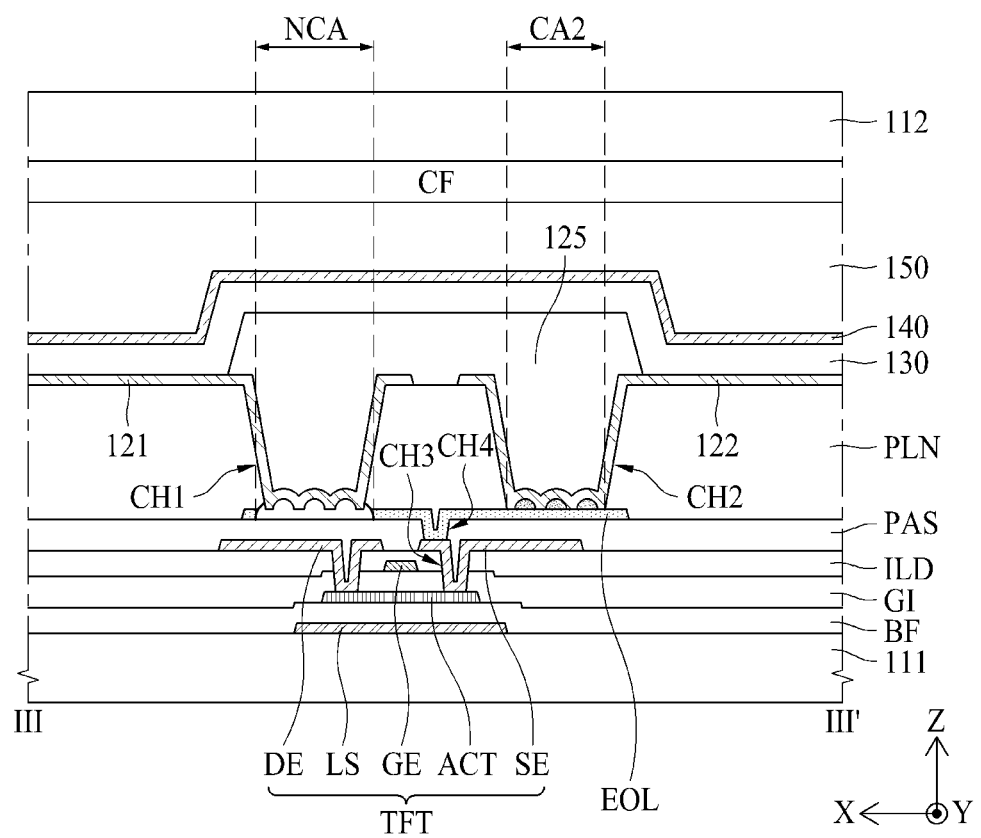
FIG. 14 is a view illustrating an example in which particles occur in one of a plurality of divided electrodes in FIG. 13.

FIG. 12 is a view illustrating another example of a pixel of a transparent display panel shown in FIG. 1, FIG. 13 is a cross-sectional view illustrating an example of line III-III' of FIG. 12, and FIG. 14 is a view illustrating an example in which particles occur in one of a plurality of divided electrodes in FIG. 13.

The transparent display panel 110 shown in FIGS. 12 to 14 is different from the transparent display panel 110 shown in FIGS. 2 to 11 in that the divided electrodes 121 and 122 of the first electrode 120 are connected to the driving transistor TFT through the conductive organic layer EOL provided between the divided electrodes 121 and 122. Hereinafter, the repeated description will be omitted, and the following description will be based on differences from FIGS. 2 to 11.

Referring to FIGS. 12 to 14, the first electrode 120 may include a first divided electrode 121 and a second divided electrode 122 without an anode connection electrode ACE. The first divided electrodes 121 may be disposed in the first divided light emission areas EA11, EA21, EA31 and EA41, and the second divided electrodes 122 may be disposed in the second divided light emission areas EA12, EA22, EA32 and EA42. The first and second divided electrodes 121 and 122 may be spaced apart from each other in the same layer.

The conductive organic layer EOL may be provided between the first divided electrode 121 and the second divided electrode 122. The conductive organic layer EOL may be provided between the transmissive area TA and the first electrode 120. One end of the conductive organic layer EOL may overlap at least a portion of the first divided electrode 121. The conductive organic layer EOL may be electrically connected to the first divided electrode 121 through the first contact hole CH1 in an area overlapped with the first divided electrode 121. The other end of the conductive organic layer EOL may overlap at least a portion of the second divided electrode 122. The conductive organic layer EOL may be electrically connected to the second divided electrode 122 through the second contact hole CH2 in an area overlapped with the second divided electrode 122.

The conductive organic layer EOL may at least partially overlap the source electrode SE or the drain electrode DE of the driving transistor TFT in the area between the first divided electrode 121 and the second divided electrode 122. The conductive organic layer EOL may be electrically connected to the source electrode SE or the drain electrode DE through a fourth contact hole CH4 in an area overlapped with the source electrode SE or the drain electrode DE.

The transparent display panel 110 according to another embodiment of the present disclosure is characterized in that the first electrode 120 comprised of the first divided electrode 121 and the second divided electrode 122 is connected to the driving transistor TFT through the conductive organic layer EOL. Therefore, in the transparent display panel 110 according to another embodiment of the present disclosure, even though particles occur in any one of the first divided electrode 121 and the second divided electrode 122, only an area in which the corresponding divided electrode is provided may be definitely a dark spot, and the other divided electrode may be normally operated.

In the transparent display panel 110 according to another embodiment of the present disclosure, particles may occur in any one 121 of the first divided electrode 121 and the second divided electrode 122. In this case, in the transparent display panel 110 according to another embodiment of the present disclosure, a short may occur between the divided electrode 121 and the second electrode 140 in the area where the particles are positioned. When an aging signal is applied to the light emitting element during an aging process, the current is concentrated on the area where the divided electrode 121 and the second electrode 140 are short-circuited, whereby significant heat may be generated by Joule heating.

In the transparent display panel 110 according to another embodiment of the present disclosure, when sufficient heat is generated in the area where the particles are positioned, the light emitting layer 130 and the second electrode 140 may be melted so that the divided electrode 121 and the second electrode 140 may be insulated from each other.

However, when sufficient heat is not generated in the area where the particles are positioned, the light emitting layer 130 and the second electrode 140 are not melted, and the divided electrode 121 and the second electrode 140 may be still short-circuited. In this case, light may not be emitted even in the area, in which the other divided electrode 122 is provided, as well as the divided electrode 121 in which particles occur.

In the transparent display panel 110 according to another embodiment of the present disclosure, the divided electrode 121, in which particles occur, and the driving transistor TFT may be disconnected from each other, so that light may be emitted in the area in which the divided electrode 122 having no particles is provided.

In detail, in the transparent display panel 110 according to another embodiment of the present disclosure, as shown in FIG. 13, the first divided electrode 121 and the second divided electrode 122 may be connected to the driving transistor TFT through the conductive organic layer EOL without being directly connected to the driving transistor TFT.

The first contact hole CH1 may expose at least a portion of the conductive organic layer EOL and at least a portion of the organic pattern OSL by passing through the planarization layer PLN. The first divided electrode 121 may include a first contact area CA1 that is in contact with at least a portion of the conductive organic layer EOL and at least a portion of the organic pattern OSL, which are exposed by the first contact hole CH1.

The second contact hole CH2 may expose at least a portion of the conductive organic layer EOL and at least a portion of the organic pattern OSL, by passing through the planarization layer PLN. The second divided electrode 122 may include a second contact area CA2 that is in contact with at least a portion of the conductive organic layer EOL and at least a portion of the organic pattern OSL, which are exposed by the second contact hole CH2.

When particles occur in any one of the first divided electrode 121 and the second divided electrode 122, the current is concentrated on the divided electrode in which particles occur, whereby a large amount of current flows even in the contact area CA. For example, when particles occur in the first divided electrode 121, the current is concentrated on the first divided electrode in which particles occur, whereby a large amount current flows even in the first contact area CA1. As a result, significant heat may be generated in the first contact area CA1 by Joule heating.

When sufficient heat is generated in the first contact area CA1 of the first divided electrode 121 in which particles occur, the conductive organic layer EOL and the organic pattern OSL, which are disposed in the first contact area CA1, may be melted as shown in FIG. 14 so that the first divided electrode 121 and the transistor connection electrode TCE may be electrically separated from each other. Therefore, the first contact area CA1 may be changed to a non-contact area NCA where the first divided electrode 121 and the conductive organic layer EOL are not in contact with each other.

As a result, in the transparent display panel 110 according to another embodiment of the present disclosure, the divided electrode 121 in which particles occur and the driving transistor TFT may be electrically separated from each other without laser cutting. Therefore, in the transparent display panel 110 according to another embodiment of the present disclosure, other lines and circuit elements may be prevented from being damaged by the laser, and a separate laser cutting process is not required, whereby the process may be simplified, and the process time may be shortened.

Also, in the transparent display panel 110 according to another embodiment of the present disclosure, since the conductive organic layer EOL has only to be in contact with the divided electrodes 121 and 122, other lines and circuit elements may be designed to at least partially overlap the conductive organic layer EOL. Therefore, in the transparent display panel 110 according to another embodiment of the present disclosure, the size of the light emission area EA or the transmissive area TA may not be reduced when the conductive organic layer EOL is provided. That is, in the transparent display panel 110 according to another embodiment of the present disclosure, the conductive organic layer EOL may be provided without reduction of an aperture ratio and reduction of transmittance.

Also, in the transparent display panel 110 according to another embodiment of the present disclosure, when particles occur, the light emitting layer 130 and the second electrode 140 of the area in which the particles are positioned may be melted or sublimated by Joule heating, so that primary aging may be performed. In the transparent display panel 110 according to another embodiment of the present disclosure, only the area in which particles occur may locally be a dark spot. However, the primary aging may be performed even though sufficient heat is not generated in the area in which the particles are positioned or the divided electrode and the second electrode 140 may be still electrically connected to each other without being insulated from each other depending on the state that the light emitting layer 130 and the second electrode 140 are melted.

In this case, in the transparent display panel 110 according to another embodiment of the present disclosure, as the current is still concentrated on the divided electrode in which particles occur, the conductive organic layer EOL and the organic pattern OSL of the contact area CA may be melted or sublimated by Joule heating so that secondary aging may be performed. As a result, in the transparent display panel 110 according to another embodiment of the present disclosure, only a portion of the subpixel, in which particles occur, may definitely become a dark spot, and all of the subpixels may be prevented from being dark spots.

Meanwhile, in the transparent display panel 110 according to another embodiment of the present disclosure, a contact size of the conductive organic layer EOL and the first electrode 120 may be provided to be different for each subpixel. In this case, the contact size of the conductive organic layer EOL and the first electrode 120 may represent a total sum of sizes of the conductive organic layer EOL that is in contact with the divided electrodes 121 and 122 in the contact area CA.

In detail, in the transparent display panel 110 according to another embodiment of the present disclosure, the contact size of the conductive organic layer EOL and the first electrode 120 may be provided differently for each subpixel in consideration of the size of the current supplied from the driving transistor TFT.

In the transparent display panel 110 according to another embodiment of the present disclosure, the contact size between the conductive organic layer EOL and the first electrode 120 may be adjusted, so that the contact resistance between the conductive organic layer EOL and the first electrode 120 may be adjusted. As a result, in the transparent display panel 110 according to another embodiment of the present disclosure, the contact resistance between the first electrode 120 and the conductive organic layer EOL may be similar in the first to fourth subpixels SP1, SP2, SP3 and SP4.

Meanwhile, in the transparent display panel 110 according to another embodiment of the present disclosure, the contact size between the conductive organic layer EOL and the first electrode 120 in each of the subpixels SP1, SP2, SP3 and SP4 may be adjusted based on at least one of the width and the spaced distance of the organic pattern OSL that is in contact with the first electrode 120.

In one embodiment of the present disclosure, the organic pattern OSL that is in contact with the first electrode 120 may have a different width for each of the subpixels SP1, SP2, SP3 and SP4. The organic pattern OSL may have a width that is varied depending on the limit current of the driving transistor TFT of each of the subpixels SP1, SP2, SP3 and SP4.

In another embodiment, the spaced distance of the organic pattern OSL that is in contact with the first electrode 120 may be different for each of the subpixels SP1, SP2, SP3 and SP4. The spaced distance of the organic pattern OSL may be varied depending on the limit current of the driving transistor TFT of each of the subpixels SP1, SP2, SP3 and SP4.

In still another embodiment, the width and the spaced distance of the organic pattern OSL that is in contact with the first electrode 120 may be different for each of the subpixels SP1, SP2, SP3 and SP4. The width and the spaced distance of the organic pattern OSL may be varied depending on the limit current of the driving transistor TFT of each of the subpixels SP1, SP2, SP3 and SP4. When the limit current of the driving transistor TFT of each of the subpixels SP1, SP2, SP3 and SP4 is low, the width and the spaced distance of the organic pattern OSL may be appropriately designed such that the contact size between the conductive organic layer EOL and the first electrode 120 is reduced in the contact area CA.

In the transparent display panel 110 according to another embodiment of the present disclosure, the contact size between the first electrode 120 and the conductive organic layer EOL may be adjusted in consideration of the limit current of the driving transistor TFT of each of the subpixels SP1, SP2, SP3 and SP4. Therefore, in the transparent display panel 110 according to another embodiment of the present disclosure, even though the driving transistor TFT has a low limit current, the first electrode 120 and the driving transistor TFT may be electrically separated from each other in the contact area CA when particles occur.

In the transparent display panel 110 shown in FIGS. 12 to 14, the divided electrodes 121 and 122 of the first electrode 120 may be connected to the driving transistor TFT through the conductive organic layer EOL provided between the divided electrodes 121 and 122. In the transparent display panel 110 shown in FIGS. 12 to 14, since the anode connection electrode ACE, the transistor connection electrode TCE, the first contact hole CH1 and the second contact hole CH2 are not provided between the transmissive area TA and the subpixels SP1, SP2, SP3 and SP4, the size of the transmissive area TA or transmittance may not be reduced by these elements. Therefore, the transparent display panel 110 shown in FIGS. 12 to 14 may improve transmittance as compared with the transparent display panel 110 shown in FIGS. 2 to 11.

According to the present disclosure, the following advantageous effects may be obtained.

In the present disclosure, the first electrode of the light emitting element is provided to be electrically connected with the driving transistor through the conductive organic layer, so that the conductive organic layer may be melted or sublimated when particles occur, whereby the first electrode and the driving transistor may be electrically separated from each other. When a short occurs between one of the first and second divided electrodes and the second electrode, a conductive organic layer and an organic pattern, which are in contact with the divided electrode in which the short occurs, may be melted or sublimated to electrically separate the divided electrode, in which the short occurs, from the driving transistor. That is, in the present disclosure, since the divided electrode in which particles occur and the driving transistor are electrically separated from each other without laser cutting, other lines and circuit elements may be prevented from being damaged by the laser, and a separate laser cutting process is not required, whereby the process may be simplified, and the process time may be shortened.

Also, the size of the light emission area or the transmissive area may not be reduced when the conductive organic layer is provided.

Also, in the present disclosure, the light emitting layer and the second electrode of the area in which the particles are positioned may be melted or sublimated by Joule heating, so that primary aging may be performed. Also, the conductive organic layer and the organic pattern may be melted or sublimated by Joule heating in the contact area where the divided electrode and the conductive organic layer are in contact with each other, so that secondary aging may be performed. In this way, in the present disclosure, the size of the light emission area that becomes a dark spot through primary aging and secondary aging may be reduced, and only the area in which particles occur may definitely become a dark spot.

Also, in the present disclosure, the contact size between the first electrode and the conductive organic layer may be adjusted in consideration of the limit current of the driving transistor of each of the subpixels. Therefore, even though the driving transistor has a low limit current, the first electrode and the driving transistor may be electrically separated from each other in the contact area when particles occur.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A transparent display device, comprising:
   a plurality of transmissive areas; and
   a plurality of subpixels disposed between the plurality of transmissive areas,
   wherein each of the plurality of subpixels includes:
      a driving transistor including an active layer, a gate electrode, a source electrode and a drain electrode;
      a light emitting element including a first electrode, a light emitting layer and a second electrode;
      a conductive organic layer provided between the driving transistor and the first electrode of the light emitting element to electrically connect the driving transistor with the first electrode; and
      an organic pattern provided over the conductive organic layer to expose at least a portion of the conductive organic layer,
      wherein the first electrode includes a first electrode portion and a second electrode portion, and the conductive organic layer is electrically connected to the first electrode portion through a first contact hole and is electrically connected to the second electrode portion through a second contact hole, and
      wherein the organic pattern at least partially overlaps the first contact hole and the second contact hole.

2. The transparent display device of claim 1, wherein the conductive organic layer is directly provided on an upper surface of the source electrode or the drain electrode.

3. The transparent display device of claim 1, further comprising:
   at least one insulating layer disposed between the conductive organic layer and the driving transistor,
   wherein the conductive organic layer is electrically connected to the source electrode or the drain electrode of the driving transistor through a third contact hole passing through the at least one insulating layer.

4. The transparent display device of claim 1, wherein the organic pattern has conductivity lower than that of the conductive organic layer.

5. The transparent display device of claim 1, wherein the organic pattern has a line shape or a dot shape.

6. The transparent display device of claim 1, wherein
   the plurality of subpixels includes a first subpixel emitting light of a first color and a second subpixel emitting light of a second color; and
   a portion of the organic pattern provided in the first subpixel has a width or a spaced distance, which is different from that of a portion of the organic pattern provided in the second subpixel.

7. The transparent display device of claim 6, wherein
   the driving transistor provided in the first subpixel has a limit current lower than that of the driving transistor provided in the second subpixel; and
   the first electrode provided in the first subpixel has a contact size with the conductive organic layer, which is smaller than that of the first electrode provided in the second subpixel.

8. The transparent display device of claim 1, wherein the conductive organic layer includes a flat portion and an uneven pattern portion provided over the flat portion.

9. The transparent display device of claim 1, wherein the conductive organic layer is provided between the transmissive area and the first electrode.

10. The transparent display device of claim 1, further comprising:
    a transistor connection electrode extended from the source electrode or the drain electrode of the driving transistor in a direction toward the transmissive area, the transistor connection electrode being in contact with the conductive organic layer in at least a portion thereof;
    a first anode connection portion having one end connected to the first electrode portion and the other end connected to the conductive organic layer through the first contact hole; and
    a second anode connection portion having one end connected to the second electrode portion and the other end connected to the conductive organic layer through the second contact hole.

11. The transparent display device of claim 1, wherein the conductive organic layer is provided between the first electrode portion and the second electrode portion, and one end of the conductive organic layer overlaps at least a portion of the first electrode portion and the other end of the conductive organic layer overlaps at least a portion of the second electrode portion.

12. A transparent display device, comprising:
    a driving transistor;
    a conductive organic layer having first conductivity, electrically connected to the driving transistor;
    an organic pattern provided over the conductive organic layer to expose at least a portion of the conductive organic layer, the organic pattern having second conductivity smaller than the first conductivity;
    a planarization layer provided over the conductive organic layer and the organic pattern;
    a first electrode provided over the planarization layer and electrically connected to the conductive organic layer through a contact hole;
    a light emitting layer provided over the first electrode; and
    a second electrode provided over the light emitting layer,
    wherein the first electrode includes a first electrode portion and a second electrode portion,
    wherein the conductive organic layer is electrically connected to the first electrode portion through a first contact hole and is electrically connected to the second electrode portion through a second contact hole, and
    wherein the organic pattern at least partially overlaps the first contact hole and the second contact hole.

13. The transparent display device of claim 12, wherein each of the first contact hole and the second contact hole exposes at least a portion of the conductive organic layer and at least a portion of the organic pattern by passing through the planarization layer.

14. The transparent display device of claim 12, wherein, when a short occurs between one of the first and second electrode portions and the second electrode, a portion of the conductive organic layer and a portion of the organic pattern, which are in contact with the electrode portion of the first and second electrode portions in which the short occurs, are melted or sublimated to electrically separate the electrode portion, in which the short occurs, from the driving transistor.

15. The transparent display device of claim 12, wherein a size of the conductive organic layer exposed by the first contact hole and the second contact hole is different for each of a plurality of subpixels depending on a limit current of the driving transistor of each of the plurality of subpixels.

16. The transparent display device of claim 12, wherein the organic pattern includes a plurality of line patterns; and the plurality of line patterns have at least one of a width and a spaced distance that is different for each of a plurality of subpixels depending on a limit current of the driving transistor of each of the plurality of subpixels.

17. The transparent display device of claim 12, further comprising:

at least one insulating layer provided between the conductive organic layer and the driving transistor, wherein the conductive organic layer is electrically connected to the driving transistor through a third contact hole passing through the at least one insulating layer.

* * * * *